(12) United States Patent
Carrasco et al.

(10) Patent No.: US 9,633,143 B2
(45) Date of Patent: Apr. 25, 2017

(54) PROCESS AND APPARATUS FOR GENERATING A THREE-DIMENSIONAL SWEPT ENVELOPE OF A VEHICLE

(75) Inventors: Milton Santano Elias Carrasco, Richmond (CA); Daniel Akwera Shihundu, Richmond (CA); Billy Siu Fai Chan, Richmond (CA); Steven Kin-Shing Cheng, Vancouver (CA); Christian Grant Milne, New Westminster (CA); Guanggui Pei, New Westminster (CA); Darren Earl Brown, Burnaby (CA); Li Ding, Richmond (CA)

(73) Assignee: Transoft Solutions, Inc., Richmond, BC (CA)

( * ) Notice: Subject to any disclaimer, the term of this patent is extended or adjusted under 35 U.S.C. 154(b) by 724 days.

(21) Appl. No.: 14/110,703

(22) PCT Filed: Apr. 5, 2012

(86) PCT No.: PCT/CA2012/000336
§ 371 (c)(1),
(2), (4) Date: Oct. 8, 2013

(87) PCT Pub. No.: WO2012/135947
PCT Pub. Date: Oct. 11, 2012

(65) Prior Publication Data
US 2014/0032184 A1 Jan. 30, 2014

Related U.S. Application Data

(60) Provisional application No. 61/473,586, filed on Apr. 8, 2011.

(51) Int. Cl.
*G06G 7/48* (2006.01)
*G06F 17/50* (2006.01)

(52) U.S. Cl.
CPC ...... *G06F 17/5009* (2013.01); *G06F 17/5095* (2013.01)

(58) Field of Classification Search
CPC ........... F01L 9/04; G01C 21/00; G05B 17/02; B60N 2/002; G05D 1/027; A61G 5/061; G01B 11/275; B60K 17/30
See application file for complete search history.

(56) References Cited

U.S. PATENT DOCUMENTS

2001/0043450 A1* 11/2001 Seale ................ F01L 9/04
361/160
2003/0079207 A1* 4/2003 Xavier ............... G05B 17/02
717/135
(Continued)

FOREIGN PATENT DOCUMENTS

WO WO 2010/060180 6/2010

OTHER PUBLICATIONS

Redon et al., "Interactive and continuous collision detection for avatars in virtual environments", IEEE, 2004.*
(Continued)

*Primary Examiner* — Kandasamy Thangavelu
(74) *Attorney, Agent, or Firm* — Knobbe Martens Olson & Bear LLP

(57) ABSTRACT

A method, apparatus, media and signals for generating a computer representation of a three-dimensional swept envelope of a vehicle having a wheeled chassis operable to support a vehicle body for movement along a terrain is disclosed. The method involves receiving terrain data representing a 3D terrain, receiving data defining parameters of the vehicle, and receiving data defining a path for movement of the vehicle from an initial position on the terrain to a displaced position on the terrain. The method also involves disposing a computer representation of the vehicle on the 3D representation of the terrain at successive locations along the
(Continued)

path using the parameters. Disposing involves determining points of engagement between wheels of the wheeled chassis and the 3D representation of the terrain to dispose the chassis with respect to the terrain, and determining a corresponding 3D location of the vehicle body with respect to the terrain. The method further involves generating a plurality of spatial extents of the vehicle at the successive locations, the spatial extents defining the 3D swept envelope of the vehicle when moving between the initial position and the displaced position. In another aspect a method for generating a computer representation of a three-dimensional swept envelope of an object moving along a guideway disposed with respect to a 3D representation of a terrain is disclosed.

52 Claims, 18 Drawing Sheets

(56) References Cited

U.S. PATENT DOCUMENTS

| | | | | |
|---|---|---|---|---|
| 2005/0075784 | A1* | 4/2005 | Gray | G01C 21/00 701/25 |
| 2005/0131607 | A1* | 6/2005 | Breed | B60N 2/002 701/45 |
| 2006/0095171 | A1* | 5/2006 | Whittaker | G05D 1/027 701/25 |
| 2006/0225942 | A1* | 10/2006 | Weagle | B62K 5/00 180/357 |
| 2008/0086248 | A1* | 4/2008 | Lu | G05D 1/0891 701/41 |
| 2010/0324782 | A1* | 12/2010 | Gupta | B60K 17/30 701/41 |
| 2012/0026293 | A1* | 2/2012 | Gruetzmann | G01B 11/275 348/46 |
| 2012/0313335 | A1* | 12/2012 | Zanderlehn | A61G 5/061 280/5.28 |

OTHER PUBLICATIONS

Belkhouche et al. "An approach for collaborative path planning in multi-robot systems", IEEE 2009.*
"Bogie", Wikipedia, Nov. 2016.*
"Chassis"—Wikipedia, Nov. 2016.*
Austen, Vicki. "Railway Group Guidance Note GE/GN8573." Oct. 1, 2004. pp. 1-106, XP055143394, Evergreen House, 160 Euston Road, London NW1 2DX, United Kingdom. Retrieved from the Internet: URL:http://www.rgsonline.co.uk/Railway_Group_Standards/Infrastructure/Guidance%20Notes/GEGN8573%20Iss%201. pdf Retrieved on Dec. 8, 2014.
AutoTURN 7.0 Product Brochure. Jun. 24, 2010. pp. 1-4, XP055143391, Retrieved from the Internet: URL:https://web.archive.org/web/20100624093807/http:www.transoftsolutions.com/Resources/ProdDocs/En/AT7NA.pdf Retrieved on Dec. 8, 2014..
BRT V8i(SS1) Swept Envelope factors—Rail Design Forum—Rail Design—Bentley Communities, Rail Design Forum, Aug. 20, 2010, pp. 1-5, XP055143387, Retrieved from the Internet: URL:http://communities.bentley.com/products/rail_design/f/5921/t/50101. aspx Retrieved on Dec. 8, 2014.
Extended European Search Report for European Application No. 12767815.9-1954 dated Oct. 15, 2014.
Bentley Rail Track Update, Bentley Systems UK, 2010, Robert Nice http://www.bentleyuser.se/2010_BUSdagar/doc/Bentley_Rail_Track_Update.pdf pp. 44-48.
Ferre, E.; Laumond, J.-P.; "An iterative diffusion algorithm for part disassembly," Robotics and Automation, 2004. Proceedings. ICRA '04. 2004 IEEE International Conference on, vol. 3, pp. 3149-3154, Apr. 26-May 1, 2004.
Hait, A.; Simeon, T.; "Motion planning on rough terrain for an articulated vehicle in presence of uncertainties," Intelligent Robots and Systems '96, IROS 96, Proceedings of the 1996 IEEE/RSJ International Converence. vol. 3, pp. 1126-1133, Nov. 4-8, 1996.
Himmelstein, J.C.; Ferre, E.; Laumond, J.P., "Swept Volume Approximation of Polygon Soups," Automation Science and Engineering, IEEE Transactions on, vol. 7, No. 1, pp. 177-183, Jan. 2010.
International Search Report for International Application No. PCT/CA2012/000336 dated Jul. 17, 2012.
Rohde, Mitchell M. et al. "An interactive physics-based unmanned ground vehicle simulator leveraging open source gaming technology: progress in the development and application of the virtual autonomous navigation environment (VANE) desktop." Unmanned Systems Technology XI. Ed. Grant Ro. Gerhart, Douglas W. Gage, & Charles M. Shoemaker. Orlando , FL, USA: SPIE, 2009. SPIE The International Society for Optical Engineering.
Wang Guoping, Sun Jiaguang, Hua Xuanji, "The sweep-envelope differential equation algorithm for general deformed swept volumes." Computer Aided Geometric Design, vol. 17, Issue 5, May 2000, pp. 399-418.
User Manual for AutoTrack—Advanced vehicle swept path analysis, 2010. http://liveweb.archive.org/http://www.savoy.co.uk/atrack890.pdf.

* cited by examiner

350

|  | | Tractor | Trailer | Units |
|---|---|---|---|---|
| 352 | Length Overall (LOA) | 10 | 6.3 | m |
| 354 | Front Overhang (F) | 2.7 | 5.3 | m |
| 355 | Ground clearance (G1,G2,G3) | 0.45, 0.45, 0.5 | 0.5 | m |
| 356 | Wheelbase (WB) | 5.8 | na | m |
| 358 | Hitch Overhang (C1, C2) | 2.3 | 0.8 | m |
| 360 | Front axle | 1 | na | each |
| 362 | Front axle track (T) | 2.6 | na | m |
| 364 | Front axle wheels | 2 | na | each |
| 366 | Front wheel tire (D/W) | 686 / 171 | na | mm |
| 368 | Rear axle | 1 | 1 | each |
| 370 | Rear axle track | 2.6 | 2.6 | m |
| 372 | Rear axle wheels | 4 | 2 | each |
| 374 | Rear wheel tire (D/W) | 686 / 171 | 686 / 171 | mm |
| 376 | Body width (BW) | 2.6 | 2.6 | m |
| 378 | Body height (H) | 3.3 | 3.3 | m |
| 380 | Articulating angle ($a$) |  | 70 | degrees |
| 382 | Pitch |  | 20 | degrees |
| 384 | Roll |  | 5 | degrees |
| 386 | Steering lock angle ($b$) | 41.8 | na | degrees |
| 388 | Lock-to-lock time | 6 | na | Seconds |

FIG. 7

PROCESS AND APPARATUS FOR GENERATING A THREE-DIMENSIONAL SWEPT ENVELOPE OF A VEHICLE

CROSS-REFERENCE TO RELATED APPLICATIONS

This application is a United States national stage application under 35 U.S.C. §371 of PCT Application No. PCT/CA2012/000336 designating the United States, filed on Apr. 5, 2012, which claims a benefit of priority to U.S. Provisional Patent Application No. 61/473,586, filed Apr. 8, 2011, the contents of each are incorporated herein by reference in their entirety. Any and all priority claims identified in the Application Data Sheet, or any correction thereto, are hereby incorporated by reference under 37 C.F.R. §1.57.

BACKGROUND OF THE INVENTION

1. Field of Invention

This invention relates generally to computer aided design and more particularly to generating a three-dimensional swept envelope of a vehicle or object.

2. Description of Related Art

Computer aided design of transport infrastructure such as railways, roadways, parking lots and garages, airports and the like may be facilitated by various computer aided design (CAD) software products that represent aspects of the infrastructure so that design choices may be visualized on a computer display. As such, CAD provides a valuable input into the design process.

CAD movements of vehicles through such infrastructure have generally been accommodated by two-dimensional simplifications in CAD software products. Such products do not easily facilitate determination of interferences between portions of the infrastructure (e.g. an overpass) and the vehicle. There remains a need for three-dimensional representations of vehicle movements over a three-dimensional terrain.

SUMMARY OF THE INVENTION

In accordance with one aspect of the invention there is provided a method for generating a computer representation of a three-dimensional swept envelope of a vehicle having a wheeled chassis operable to support a vehicle body for movement along a terrain. The method involves receiving terrain data representing a 3D terrain, receiving data defining parameters of the vehicle, and receiving data defining a path for movement of the vehicle from an initial position on the terrain to a displaced position on the terrain. The method also involves disposing a computer representation of the vehicle on the 3D representation of the terrain at successive locations along the path using the parameters. Disposing involves determining points of engagement between wheels of the wheeled chassis and the 3D representation of the terrain to dispose the chassis with respect to the terrain, and determining a corresponding 3D location of the vehicle body with respect to the terrain. The method further involves generating a plurality of spatial extents of the vehicle at the successive locations, the spatial extents defining the 3D swept envelope of the vehicle when moving between the initial position and the displaced position.

Generating the plurality of spatial extents of the vehicle may involve generating a plurality of spaced apart intersecting planes along the movement path, and determining an intersection of the computer representation of vehicle with each of the intersection planes at the successive locations of the vehicle along the movement path.

Generating the plurality of spaced apart intersecting planes may involve generating intersection planes that are substantially perpendicular to the movement path.

Determining the intersection of the computer representation of the vehicle with each of the intersection planes may involve for each intersection plane, determining a plurality of intersection areas each corresponding to one of the successive locations of the vehicle along the movement path, and forming a union of the plurality of intersection areas to generate a combined intersection area defining a spatial extent of the vehicle moving through the intersection plane.

Determining the plurality of intersection areas may involve representing the vehicle using at least one 3D geometric shape, imposing a raster on the intersection plane, the raster including a plurality of raster elements, and identifying ones of the plurality of raster elements that lie within the 3D geometric shape for each successive position, the identified ones of the plurality of raster elements corresponding to the combined intersection area.

The method may involve generating signals operable to cause display of a representation of the 3D swept envelope of the vehicle on a computer display.

The method may involve generating signals operable to cause a representation of the 3D swept envelope of the vehicle to be printed on a printer.

Receiving the terrain data may involve receiving a plurality of 3D coordinate locations defining the terrain.

Receiving the 3D coordinate locations may involve receiving a plurality of vertex locations defining coordinate locations of a plurality of polygons defining the terrain.

Receiving the plurality of vertex locations may involve receiving a plurality of vertex locations defining one of a triangular irregular mesh and a polyface mesh.

Receiving data defining the parameters of the vehicle may involve receiving an operator selection of a vehicle from a database of vehicles, the database including associated parameters for each vehicle in the database.

Receiving data defining the parameters of the vehicle may involve receiving at least one of chassis parameters defining relative orientations of the wheels of the wheeled chassis, vehicle body parameters defining spatial extents of the vehicle body, and linkage parameters defining a linkage between the chassis and the vehicle body.

Receiving the chassis parameters may involve receiving at least one of a number of axels in a front axel group, a number of axels in a rear axel group, a number of wheels on each respective axel of the front and rear axel groups, an identification of steering parameters associated with the front and rear axel groups, wheel dimensions of the wheels, track dimensions associated with each of the front and rear axel groups, a wheelbase dimension defining a distance between the front axel group and the rear axel group, and a hitch dimension defining a location of a trailer hitch with respect to the chassis.

Receiving the vehicle body parameters may involve receiving at least one of overall dimensions of the vehicle body, a location of the vehicle chassis with respect to the vehicle body, a roofline profile of the vehicle body, clearance dimensions defining clearances between the vehicle body when engaging a flat surface, and undercarriage profiles defining a peripheral shape of the body proximate respective front and rear axels of the chassis.

Receiving the linkage parameters may involve receiving a suspension maximum deflection defining a maximum displacement of each the wheel with respect to the body.

Receiving the data defining the path of travel may involve receiving operator input of a line extending between the initial position and the displaced position.

Receiving the operator input of the line may involve receiving operator input of a two-dimensional arc and the method may further involve projecting the arc onto the terrain to obtain a three-dimensional path of travel extending between the initial position and the displaced position on the terrain.

The method may involve receiving operator input of a change to the movement path, and in response disposing the computer representation of the vehicle on the 3D representation of the terrain at a plurality of locations along the changed movement path and generating an updated plurality of spatial extents of the vehicle.

The method may involve computing a minimum turning angle for the vehicle, computing turning angles associated with the movement from the initial position to the displaced position, and causing the movement path to be limited to include turning angles that may be less than or equal to the minimum turn angle.

Disposing the computer representation of the vehicle on the 3D representation of the terrain may involve representing the chassis of the vehicle using a bicycle model, the bicycle model having at least a front wheel and a rear wheel, each being centered between respective front and rear wheels of the vehicle and being separated by a wheelbase dimension corresponding to a wheelbase dimension of the vehicle defined by the parameters, at least one of the front wheel and the rear wheel being steerable, and for each of a plurality of locations of the bicycle model front wheel along the path of travel, orienting the front wheel tangent to the path at the location and generating a corresponding location of the rear wheel of the bicycle model.

Determining points of engagement between wheels of the wheeled chassis and the terrain may involve locating a reference point associated with a front axel of the chassis on the path, longitudinally rotating the chassis to place reference point associated with a rear axel of the chassis on the terrain, and laterally rolling the chassis to place cause wheel locations associated with the wheeled chassis to be on or proximate the terrain.

Determining the corresponding 3D location of the vehicle may involve disposing a computer representation of the vehicle body on the chassis, determining a weight distribution proportion for each wheel, and calculating a deflection of a suspension associated with each wheel to generate the 3D location of the computer representation of the vehicle body with respect to the chassis.

Generating the plurality of locations of the spatial extents of the vehicle may involve generating a three-dimensional mesh of polygons defining the spatial extents.

The method may involve identifying points of interference between the plurality of locations of the spatial extents and the terrain.

The method may involve receiving data defining at least one obstacle located on the terrain and the method may further involve identifying points of interference between the plurality of locations of the spatial extents and the at least one obstacle.

The vehicle may be a first vehicle and the method may further involve receiving data defining a 3D swept envelope of a second vehicle with respect to the 3D representation of the terrain, and identifying points of interference between the plurality of locations of the spatial extents of the first vehicle and the 3D swept envelope of the second vehicle.

The method may involve offsetting the 3D swept envelope of the vehicle to determine minimum extents of a passageway through which the vehicle must pass in moving between the initial position and the displaced position.

The method may involve receiving a definition of a plane intersecting the terrain, and determining extents of an area of intersection between the plane and the spatial extents of the vehicle as the vehicle moves through the plane.

The method may involve offsetting the area of intersection to define and locate a structure through which the vehicle must pass in moving between the initial position and the displaced position.

The wheeled chassis may include a front axel group and a rear axel group, each of the front and the rear axel groups having at least one wheel operable to engage the terrain and the computer representation of the vehicle includes a representation of each of the front and the rear axel.

The vehicle may be configured for movement along a track disposed on the terrain, the track being operable to receive and guide the wheels of the wheeled chassis and receiving the data defining the movement from the initial position to the displaced position may involve receiving data defining a desired location of the tracks with respect to the 3D representation of the terrain.

Determining the corresponding 3D location of the vehicle body with respect to the terrain may involve displacing a computer representation of the vehicle body from a computer representation of the chassis by a distance corresponding to a ground clearance parameter associated with the vehicle body, and a deflection of a suspension between the chassis and the body.

Displacing the vehicle body may involve displacing the vehicle body at each wheel location in accordance with a weight distribution proportion at the wheel location.

In accordance with another aspect of the invention there is provided a computer readable medium encoded with codes for directing a processor circuit to execute any of the methods above.

In accordance with another aspect of the invention there is provided a computer readable signal encoded with codes for directing a processor circuit to execute any of the methods above.

In accordance with another aspect of the invention there is provided an apparatus for generating a computer representation of a three-dimensional swept envelope of a vehicle having a wheeled chassis operable to support a vehicle body for movement along a terrain.

The apparatus includes provisions for receiving terrain data representing a 3D terrain, provisions for receiving data defining parameters of the vehicle, and provisions for receiving data defining a path for movement of the vehicle from an initial position on the terrain to a displaced position on the terrain. The apparatus further includes provisions for disposing a computer representation of the vehicle on the 3D representation of the terrain at successive locations along the path using the parameters. The provisions for disposing include provisions for determining points of engagement between wheels of the wheeled chassis and the 3D representation of the terrain to dispose the chassis with respect to the terrain, and provisions for determining a corresponding 3D location of the vehicle body with respect to the terrain. The apparatus further includes provisions for generating a plurality of spatial extents of the vehicle at the successive locations, the spatial extents defining the 3D swept envelope of the vehicle when moving between the initial position and the displaced position.

In accordance with another aspect of the invention there is provided an apparatus for generating a computer representation of a three-dimensional swept envelope of a vehicle having a wheeled chassis operable to support a vehicle body for movement along a terrain.

The apparatus includes a processor circuit operably configured to receive terrain data representing a 3D terrain, receive data defining parameters of the vehicle, and to receive data defining a path for movement of the vehicle from an initial position on the terrain to a displaced position on the terrain. The processor circuit is also operably configured to dispose a computer representation of the vehicle on the 3D representation of the terrain at successive locations along the path using the parameters by determining points of engagement between wheels of the wheeled chassis and the 3D representation of the terrain to dispose the chassis with respect to the terrain, and determining a corresponding 3D location of the vehicle body with respect to the terrain. The processor circuit is further operably configured to generate a plurality of spatial extents of the vehicle at the successive locations, the spatial extents defining the 3D swept envelope of the vehicle when moving between the initial position and the displaced position.

The processor circuit may be operably configured to generate the plurality of spatial extents of the vehicle by generating a plurality of spaced apart intersecting planes along the movement path, and by determining an intersection of the computer representation of vehicle with each of the intersection planes at the successive locations of the vehicle along the movement path.

The processor circuit may be operably configured to generate the plurality of spaced apart intersecting planes by generating intersection planes that are substantially perpendicular to the movement path.

The processor circuit may be operably configured to determine the intersection of the computer representation of the vehicle with each of the intersection planes by, for each intersection plane, determining a plurality of intersection areas each corresponding to one of the successive locations of the vehicle along the movement path, and forming a union of the plurality of intersection areas to generate a combined intersection area defining a spatial extent of the vehicle moving through the intersection plane.

The processor circuit may be operably configured to determine the plurality of intersection areas by representing the vehicle using at least one 3D geometric shape, imposing a raster on the intersection plane, the raster including a plurality of raster elements, and identifying ones of the plurality of raster elements that lie within the 3D geometric shape for each successive position, the identified ones of the plurality of raster elements corresponding to the combined intersection area.

The processor circuit may be operably configured to generate signals operable to cause display of a representation of the 3D swept envelope of the vehicle on a computer display.

The processor circuit may be operably configured to generate signals operable to cause a representation of the 3D swept envelope of the vehicle to be printed on a printer.

The processor circuit may be operably configured to receive the terrain data by receiving a plurality of 3D coordinate locations defining the terrain.

The processor circuit may be operably configured to receive the 3D coordinate locations by receiving a plurality of vertex locations defining coordinate locations of a plurality of polygons defining the terrain.

The processor circuit may be operably configured to receive the plurality of vertex locations by receiving a plurality of vertex locations defining one of a triangular irregular mesh and a polyface mesh.

The processor circuit may be operably configured to receive data defining the parameters of the vehicle by receiving an operator selection of a vehicle from a database of vehicles, the database including associated parameters for each vehicle in the database.

The processor circuit may be operably configured to receive data defining the parameters of the vehicle by receiving at least one of chassis parameters defining relative orientations of the wheels of the wheeled chassis, vehicle body parameters defining spatial extents of the vehicle body, and linkage parameters defining a linkage between the chassis and the vehicle body.

The processor circuit may be operably configured to receive the chassis parameters by receiving at least one of a number of axels in a front axel group, a number of axels in a rear axel group, a number of wheels on each respective axel of the front and rear axel groups, an identification of steering parameters associated with the front and rear axel groups, wheel dimensions of the wheels, track dimensions associated with each of the front and rear axel groups, a wheelbase dimension defining a distance between the front axel group and the rear axel group, and a hitch dimension defining a location of a trailer hitch with respect to the chassis.

The processor circuit may be operably configured to receive the vehicle body parameters by receiving at least one of overall dimensions of the vehicle body, a location of the vehicle chassis with respect to the vehicle body, a roofline profile of the vehicle body, clearance dimensions defining clearances between the vehicle body when engaging a flat surface, and undercarriage profiles defining a peripheral shape of the body proximate respective front and rear axels of the chassis.

The processor circuit may be operably configured to receive the linkage parameters by receiving a suspension maximum deflection defining a maximum displacement of each the wheel with respect to the body.

The processor circuit may be operably configured to receive the data defining the path of travel by receiving operator input of a line extending between the initial position and the displaced position.

The processor circuit may be operably configured to receive the operator input of the line by receiving operator input of a two-dimensional arc and the processor circuit may be operably configured to project the arc onto the terrain to obtain a three-dimensional path of travel extending between the initial position and the displaced position on the terrain.

The processor circuit may be operably configured to receive operator input of a change to the movement path, and in response dispose the computer representation of the vehicle on the 3D representation of the terrain at a plurality of locations along the changed movement path and generating an updated plurality of spatial extents of the vehicle.

The processor circuit may be operably configured to compute a minimum turning angle for the vehicle, compute turning angles associated with the movement from the initial position to the displaced position, and cause the movement path to be limited to include turning angles that may be less than or equal to the minimum turn angle.

The processor circuit may be operably configured to dispose the computer representation of the vehicle on the 3D representation of the terrain by representing the chassis of the vehicle using a bicycle model, the bicycle model having at least a front wheel and a rear wheel, each being centered between respective front and rear wheels of the vehicle and being separated by a wheelbase dimension corresponding to a wheelbase dimension of the vehicle defined by the parameters, at least one of the front wheel and the rear wheel being steerable, and for each of a plurality of locations of the bicycle model front wheel along the path of travel, orienting the front wheel tangent to the path at the location and generating a corresponding location of the rear wheel of the bicycle model.

The processor circuit may be operably configured to determine points of engagement between wheels of the wheeled chassis and the terrain by locating a reference point associated with a front axle of the chassis on the path, longitudinally rotating the chassis to place reference point associated with a rear axle of the chassis on the terrain, and laterally rolling the chassis to place cause wheel locations associated with the wheeled chassis to be on or proximate the terrain.

The processor circuit may be operably configured to determine the corresponding 3D location of the vehicle by disposing a computer representation of the vehicle body on the chassis, determining a weight distribution proportion for each wheel, and calculating a deflection of a suspension associated with each wheel to generate the 3D location of the computer representation of the vehicle body with respect to the chassis.

The processor circuit may be operably configured to generate the plurality of locations of the spatial extents of the vehicle by generating a three-dimensional mesh of polygons defining the spatial extents.

The processor circuit may be operably configured to identify points of interference between the plurality of locations of the spatial extents and the terrain.

The processor circuit may be operably configured to receive data defining at least one obstacle located on the terrain and to identify points of interference between the plurality of locations of the spatial extents and the at least one obstacle.

The vehicle may be a first vehicle and the processor circuit may be operably configured to receive data defining a 3D swept envelope of a second vehicle with respect to the 3D representation of the terrain, and to identify points of interference between the plurality of locations of the spatial extents of the first vehicle and the 3D swept envelope of the second vehicle.

The processor circuit may be operably configured to offset the 3D swept envelope of the vehicle to determine minimum extents of a passageway through which the vehicle must pass in moving between the initial position and the displaced position.

The processor circuit may be operably configured to receive a definition of a plane intersecting the terrain, and to determine extents of an area of intersection between the plane and the spatial extents of the vehicle as the vehicle moves through the plane.

The processor circuit may be operably configured to offset the area of intersection to define and locate a structure through which the vehicle must pass in moving between the initial position and the displaced position.

The wheeled chassis may include a front axle group and a rear axle group, each of the front and the rear axle groups having at least one wheel operable to engage the terrain and the computer representation of the vehicle may include a representation of each of the front and the rear axle.

The vehicle may be configured for movement along a track disposed on the terrain, the track being operable to receive and guide the wheels of the wheeled chassis and the processor circuit may be operably configured to receive the data defining the movement from the initial position to the displaced position by receiving data defining a desired location of the tracks with respect to the 3D representation of the terrain.

The processor circuit may be operably configured to determine the corresponding 3D location of the vehicle body with respect to the terrain by displacing a computer representation of the vehicle body from a computer representation of the chassis by a distance corresponding to a ground clearance parameter associated with the vehicle body, and a deflection of a suspension between the chassis and the body.

The processor circuit may be operably configured to displace the vehicle body by displacing the vehicle body at each wheel location in accordance with a weight distribution proportion at the wheel location.

In accordance with another aspect of the invention there is provided a method for generating a computer representation of a three-dimensional swept envelope of an object moving along a guideway disposed with respect to a 3D representation of a terrain. The object has a support for supporting an object body for movement along the guideway. The method involves receiving data defining parameters of the object including at least parameters defining an orientation between the support and the object body, and receiving data defining the guideway location with respect to the 3D representation of the terrain. The guideway is operable to guide and support the object for movement from an initial position on the terrain to a displaced position on the terrain. The method also involves disposing a computer representation of the object body at successive locations along the guideway using the parameters, and generating a plurality of spatial extents of the object body at the successive locations, the spatial extents defining the 3D swept envelope of the object when moving between the initial position and the displaced position.

The method may involve receiving terrain data representing the 3D terrain.

Disposing may involve determining a 3D location of the support at each successive location along the guideway, and using the parameters to determine a 3D location of the object body with respect to the terrain.

The support may include a plurality of supports and determining the 3D location of the object support may involve determining a 3D location of each of the plurality of supports at each successive location along the guideway and using the parameters to determine the 3D location of the object body with respect to the terrain may involve using the parameters to determine a 3D location of the object body with respect to the determined locations of each of the plurality of supports.

The object may include a vehicle and the support may involve a magnetic suspension operable to support the vehicle for movement along the guideway.

The object may include a load supported for movement along an overhead guideway.

The object may include a load suspended from the support and the support includes at least one wheel for coupling the support to the guideway for movement.

Generating the plurality of spatial extents of the object may involve generating a plurality of spaced apart intersecting planes along the guideway, and determining an intersection of the computer representation of object with each of the intersection planes at the successive locations of the object along the guideway.

Generating the plurality of spaced apart intersecting planes may involve generating intersection planes that may be substantially perpendicular to the guideway.

Determining the intersection of the computer representation of the object with each of the intersection planes may involve for each intersection plane, determining a plurality of intersection areas each corresponding to one of the successive locations of the object along the guideway, and forming a union of the plurality of intersection areas to generate a combined intersection area defining a spatial extent of the object moving through the intersection plane.

Determining the plurality of intersection areas may involve representing the object using at least one 3D geometric shape, imposing a raster on the intersection plane, the raster may involve a plurality of raster elements, and identifying ones of the plurality of raster elements that lie within the 3D geometric shape for each successive position, the identified ones of the plurality of raster elements corresponding to the combined intersection area.

The method may involve generating signals operable to cause display of a representation of the 3D swept envelope of the object on a computer display.

The method may involve generating signals operable to cause a representation of the 3D swept envelope of the object to be printed on a printer.

Receiving the terrain data may involve receiving a plurality of 3D coordinate locations defining the terrain.

Receiving the 3D coordinate locations may involve receiving a plurality of vertex locations defining coordinate locations of a plurality of polygons defining the terrain.

Receiving the plurality of vertex locations may involve receiving a plurality of vertex locations defining one of a triangular irregular mesh and a polyface mesh.

Receiving data defining the parameters of the object may involve receiving at least one of support parameters defining relative orientations the support with respect to the guideway, object body parameters defining spatial extents of the object body, and linkage parameters defining a linkage between the support and the object body.

Receiving the object body parameters may involve receiving at least one of overall dimensions of the object body, a location of the object body with respect to the support, a profile of the object body, and undercarriage profiles defining a peripheral shape of the body proximate respective front and rear axels of the chassis.

The method may involve receiving operator input of a change to the guideway location with respect to the 3D representation of the terrain, and in response disposing the computer representation of the object on the 3D representation of the terrain at a plurality of locations along the changed guideway and generating an updated plurality of spatial extents of the object.

Generating the plurality of locations of the spatial extents of the object may involve generating a three-dimensional mesh of polygons defining the spatial extents.

The method may involve identifying points of interference between the plurality of locations of the spatial extents and the terrain.

The method may involve receiving data defining at least one obstacle located on the terrain and may further involve identifying points of interference between the plurality of locations of the spatial extents and the at least one obstacle.

The object may include a first object and the method may further involve receiving data defining a 3D swept envelope of a second object with respect to the 3D representation of the terrain, and identifying points of interference between the plurality of locations of the spatial extents of the first object and the 3D swept envelope of the second object.

The method may involve offsetting the 3D swept envelope of the object to determine minimum extents of a passageway through which the object must pass in moving between the initial position and the displaced position.

The method may involve receiving a definition of a plane intersecting the terrain, and determining extents of an area of intersection between the plane and the spatial extents of the object as the object moves through the plane.

The method may involve offsetting the area of intersection to define and locate a structure through which the object must pass in moving between the initial position and the displaced position.

In accordance with another aspect of the invention there is provided a computer readable medium encoded with codes for directing a processor circuit to execute the methods above.

In accordance with another aspect of the invention there is provided a computer readable signal encoded with codes for directing a processor circuit to execute the methods above.

In accordance with another aspect of the invention there is provided an apparatus for generating a computer representation of a three-dimensional swept envelope of an object moving along a guideway disposed with respect to a 3D representation of a terrain, the object having a support for supporting an object body for movement along the guideway. The apparatus includes provisions for receiving data defining parameters of the object including at least parameters defining an orientation between the support and the object body, and provisions for receiving data defining the guideway location with respect to the 3D representation of the terrain, the guideway being operable to guide and support the object for movement from an initial position on the terrain to a displaced position on the terrain. The apparatus also includes provisions for disposing a computer representation of the object body at successive locations along the guideway using the parameters, and provisions for generating a plurality of spatial extents of the object body at the successive locations, the spatial extents defining the 3D swept envelope of the object when moving between the initial position and the displaced position.

In accordance with another aspect of the invention there is provided an apparatus for generating a computer representation of a three-dimensional swept envelope of an object moving along a guideway disposed with respect to a 3D representation of a terrain, the object having a support for supporting an object body for movement along the guideway. The apparatus includes a processor circuit operably configured to receive data defining parameters of the object including at least parameters defining an orientation between the support and the object body, and receive data defining the guideway location with respect to the 3D representation of the terrain, the guideway being operable to guide and support the object for movement from an initial position on the terrain to a displaced position on the terrain. The processor circuit is also operably configured to dispose a computer representation of the object body at successive locations along the guideway using the parameters, and generate a plurality of spatial extents of the object body at the successive locations, the spatial extents defining the 3D swept envelope of the object when moving between the initial position and the displaced position.

The processor circuit may be operably configured to receive terrain data representing the 3D terrain.

The processor circuit may be operably configured to dispose the computer representation of the object body by determining a 3D location of the support at each successive location along the guideway, and using the parameters to determine a 3D location of the object body with respect to the terrain.

The support may include a plurality of supports and the processor circuit may be operably configured to determine the 3D location of the object support by determining a 3D location of each of the plurality of supports at each successive location along the guideway and to use the parameters to determine the 3D location of the object body with respect to the terrain by using the parameters to determine a 3D location of the object body with respect to the determined locations of each of the plurality of supports.

The object may include a vehicle and the support may include a magnetic suspension operable to support the vehicle for movement along the guideway.

The object may include a load supported for movement along an overhead guideway.

The object may include a load suspended from the support and the support may include at least one wheel for coupling the support to the guideway for movement.

The 3D representation of the terrain may include a 3D representation of a factory floor.

The processor circuit may be operably configured to generate the plurality of spatial extents of the object by generating a plurality of spaced apart intersecting planes along the guideway, and determining an intersection of the computer representation of object with each of the intersection planes at the successive locations of the object along the guideway.

The processor circuit may be operably configured to generate the plurality of spaced apart intersecting planes by generating intersection planes that may be substantially perpendicular to the guideway.

The processor circuit may be operably configured to determine the intersection of the computer representation of the object with each of the intersection planes by for each intersection plane, determining a plurality of intersection areas each corresponding to one of the successive locations of the object along the guideway, and forming a union of the plurality of intersection areas to generate a combined intersection area defining a spatial extent of the object moving through the intersection plane.

The processor circuit may be operably configured to determine the plurality of intersection areas by representing the object using at least one 3D geometric shape, imposing a raster on the intersection plane, the raster may include a plurality of raster elements, and identifying ones of the plurality of raster elements that lie within the 3D geometric shape for each successive position, the identified ones of the plurality of raster elements corresponding to the combined intersection area.

The processor circuit may be operably configured to generate signals operable to cause display of a representation of the 3D swept envelope of the object on a computer display.

The processor circuit may be operably configured to generate signals operable to cause a representation of the 3D swept envelope of the object to be printed on a printer.

The processor circuit may be operably configured to receive the terrain data by receiving a plurality of 3D coordinate locations defining the terrain.

The processor circuit may be operably configured to receive the 3D coordinate locations by receiving a plurality of vertex locations defining coordinate locations of a plurality of polygons defining the terrain.

The processor circuit may be operably configured to receive the plurality of vertex locations by receiving a plurality of vertex locations defining one of a triangular irregular mesh and a polyface mesh.

The processor circuit may be operably configured to receive data defining the parameters of the object by receiving at least one of support parameters defining relative orientations the support with respect to the guideway, object body parameters defining spatial extents of the object body, and linkage parameters defining a linkage between the support and the object body.

The processor circuit may be operably configured to receive the object body parameters by receiving at least one of overall dimensions of the object body, a location of the object body with respect to the support, a profile of the object body, and undercarriage profiles defining a peripheral shape of the body proximate respective front and rear axels of the chassis.

The processor circuit may be operably configured to receiver operator input of a change to the guideway location with respect to the 3D representation of the terrain, and in response dispose the computer representation of the object on the 3D representation of the terrain at a plurality of locations along the changed guideway and generate an updated plurality of spatial extents of the object.

The processor circuit may be operably configured to generate the plurality of locations of the spatial extents of the object by generating a three-dimensional mesh of polygons defining the spatial extents.

The processor circuit may be operably configured to identify points of interference between the plurality of locations of the spatial extents and the terrain.

The processor circuit may be operably configured to receive data defining at least one obstacle located on the terrain and to identify points of interference between the plurality of locations of the spatial extents and the at least one obstacle.

The object may include a first object and the processor circuit may be operably configured to receive data defining a 3D swept envelope of a second object with respect to the 3D representation of the terrain, and identify points of interference between the plurality of locations of the spatial extents of the first object and the 3D swept envelope of the second object.

The processor circuit may be operably configured to offset the 3D swept envelope of the object to determine minimum extents of a passageway through which the object must pass in moving between the initial position and the displaced position.

The processor circuit may be operably configured to receive a definition of a plane intersecting the terrain, and determine extents of an area of intersection between the plane and the spatial extents of the object as the object moves through the plane.

The processor circuit may be operably configured to offset the area of intersection to define and locate a structure through which the object must pass in moving between the initial position and the displaced position.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

In drawings which illustrate embodiments of the invention,

FIG. 7 is a table of exemplary vehicle parameters for a tractor-trailer combination vehicle;

DETAILED DESCRIPTION

Figure 1:
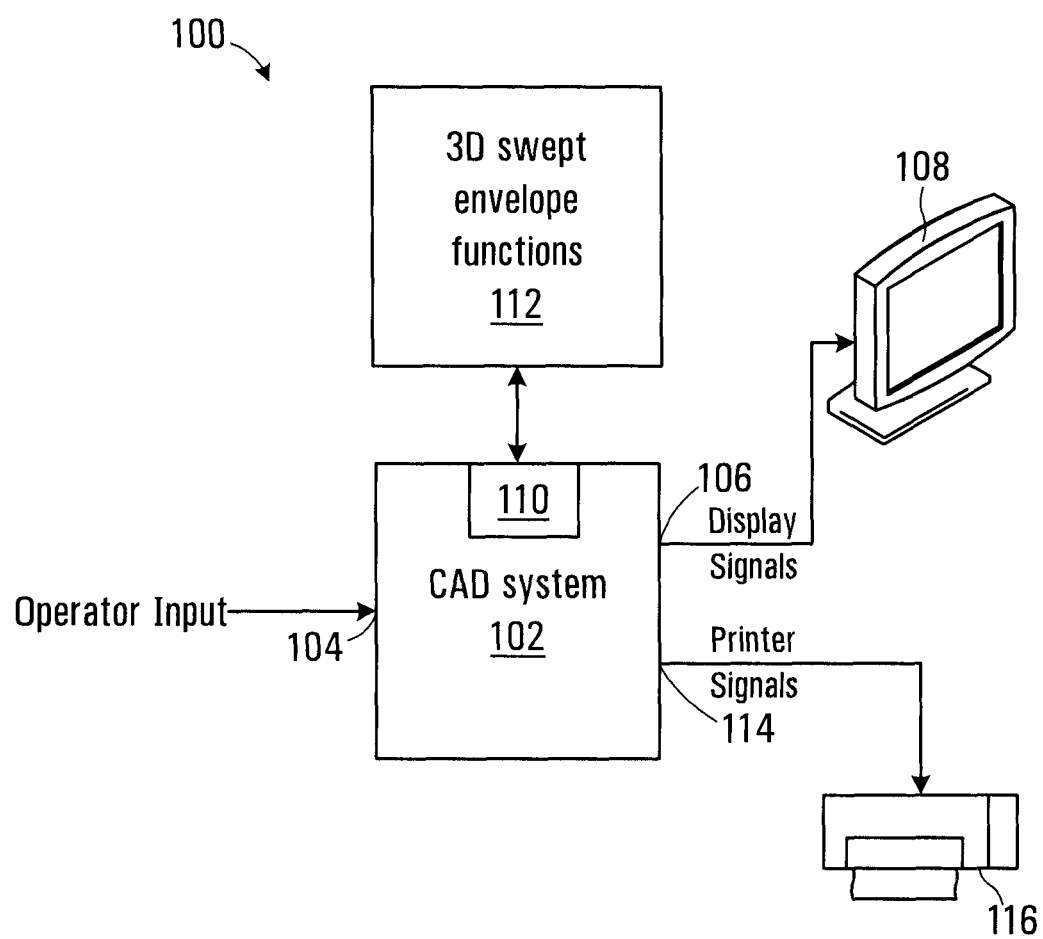
FIG. 1 is a block diagram of an apparatus for generating a three-dimensional (3D) swept envelope of a vehicle in accordance with a first embodiment.

Referring to FIG. 1, a block diagram of an apparatus for generating a three-dimensional (3D) swept envelope of a vehicle is shown generally at 100. The apparatus 100 includes a CAD system 102 having an input 104 for receiving operator input, an output 106 for producing display signals, and an output 114 for producing printer signals. In the embodiment shown, the apparatus 100 also includes a display 108 for displaying an image representing the swept envelope of the vehicle in response to receiving the display signals and a printer 116 for printing a hardcopy output of the swept envelope representation. The CAD system 102 includes an interface 110 that provides access to the CAD system functions implemented by the CAD system 102.

The apparatus also includes a 3D swept envelope functional block 112, which provides functions for causing the CAD system 102 to produce the display signals representing the 3D swept envelope. The functional block 112 interfaces with the CAD system through the interface 110.

The CAD system may be provided by causing a computer to execute CAD system software such as the AutoCAD® software application available from Autodesk Inc. of San Rafael, Calif., USA. AutoCAD provides drawing elements such as lines, polylines, circles, arcs, and other complex elements. Customization of AutoCAD is provided through ObjectARX (AutoCAD Runtime Extension), which is an application programming interface (API) that permits access to a class-based model of AutoCAD drawing elements. Customization code may be written in a programming language such as C++, which may be compiled to provide the functionality represented as the 3D swept envelope functional block 112.

Other CAD systems, such as MicroStation sold by Bentley Systems Inc. of Exton, Pa., USA, provide similar CAD functionality and interfaces for customization. Advantageously, using existing CAD software applications to provide standard CAD functionality allows operators to produce drawing files representing the traffic intersection using a familiar software application. However, in other embodiments the CAD system functional block 102 and 3D swept envelope functional block 112 may be combined to provide 3D swept envelope functions without any dependence on existing CAD software applications.

Processor Circuit

Figure 2:
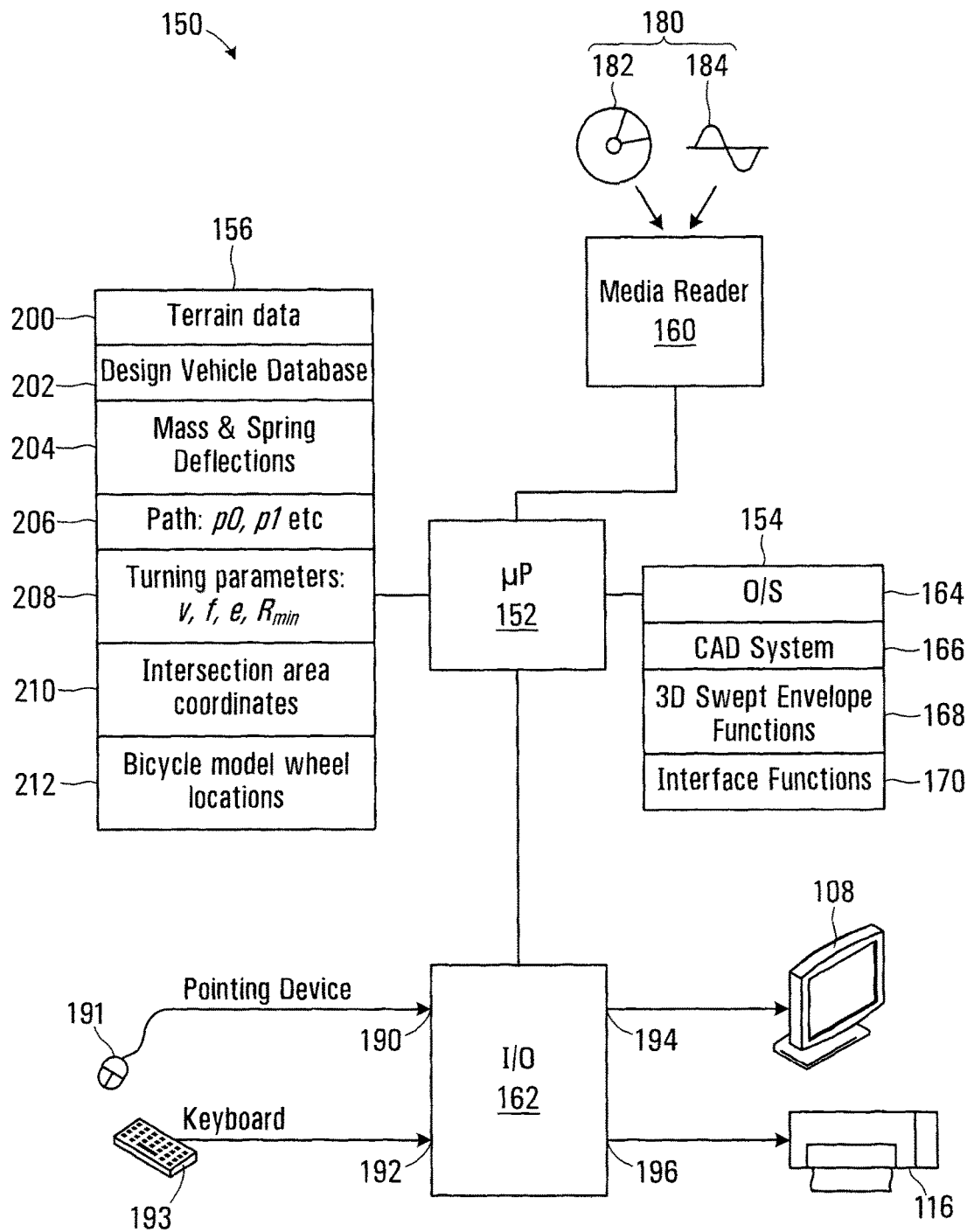
FIG. 2 is a processor circuit for implementing the apparatus shown in FIG. 1.

Referring to FIG. 2, a processor circuit for implementing the apparatus 100 (shown in FIG. 1) is shown generally at 150. The processor circuit 150 includes a microprocessor 152, a program memory 154, a variable memory 156, a media reader 160, and an input output port (I/O) 162, all of which are in communication with the microprocessor 152. While a single microprocessor 152 is shown in FIG. 2, in practice the microprocessor 152 may be implemented using multiple central processors and/or graphic processors.

Program codes for directing the microprocessor 152 to carry out various functions are stored in the program memory 154, which may be implemented as a random access memory (RAM) and/or a hard disk drive (HDD), or a combination thereof. The program memory 154 includes a first block of program codes 164 for directing the microprocessor 152 to perform operating system functions and a second block of program codes 166 for directing the microprocessor 152 to perform CAD system functions for implementing the CAD system 102 shown in FIG. 1. The program memory 154 also includes a third block of program codes 168 for directing the microprocessor 152 to perform functions for generating the 3D swept envelope and a fourth block of program codes 170 for directing the microprocessor 152 to provide an interface between the CAD functions and the 3D swept envelope functions.

The media reader 160 facilitates loading program codes into the program memory 154 from a computer readable medium 180, such as a CD ROM disk 182, or a computer readable signal 184, such as may be received over a network such as the Internet, for example.

The I/O 162 includes a first input 190 for receiving operator input signals from a pointing device 191. The pointing device may be a computer mouse, trackball, or digitizing tablet, or other device operable o produce pointer movement signals. The I/O 162 also includes a second input 192 for receiving operator input signals from a character input device, such as a keyboard 193. The I/O 162 further includes a first output 194 for producing display signals for driving the display 108 and a second output 196 for producing signals for controlling the plotter 116.

The variable memory 156 includes a plurality of storage locations including a terrain data store 200 for storing data defining a terrain, a database store 202 for storing vehicle parameters, and a store 204 for storing vehicle mass and spring deflection values. The variable memory 156 also includes a store 206 for storing path parameters, a store 208 for storing turning parameters, a store 210 for storing swept envelope intersection area coordinates, and a store 212 for storing bicycle model wheel locations. The variable memory 156 may be implemented as a hard drive, for example.

Figure 3:
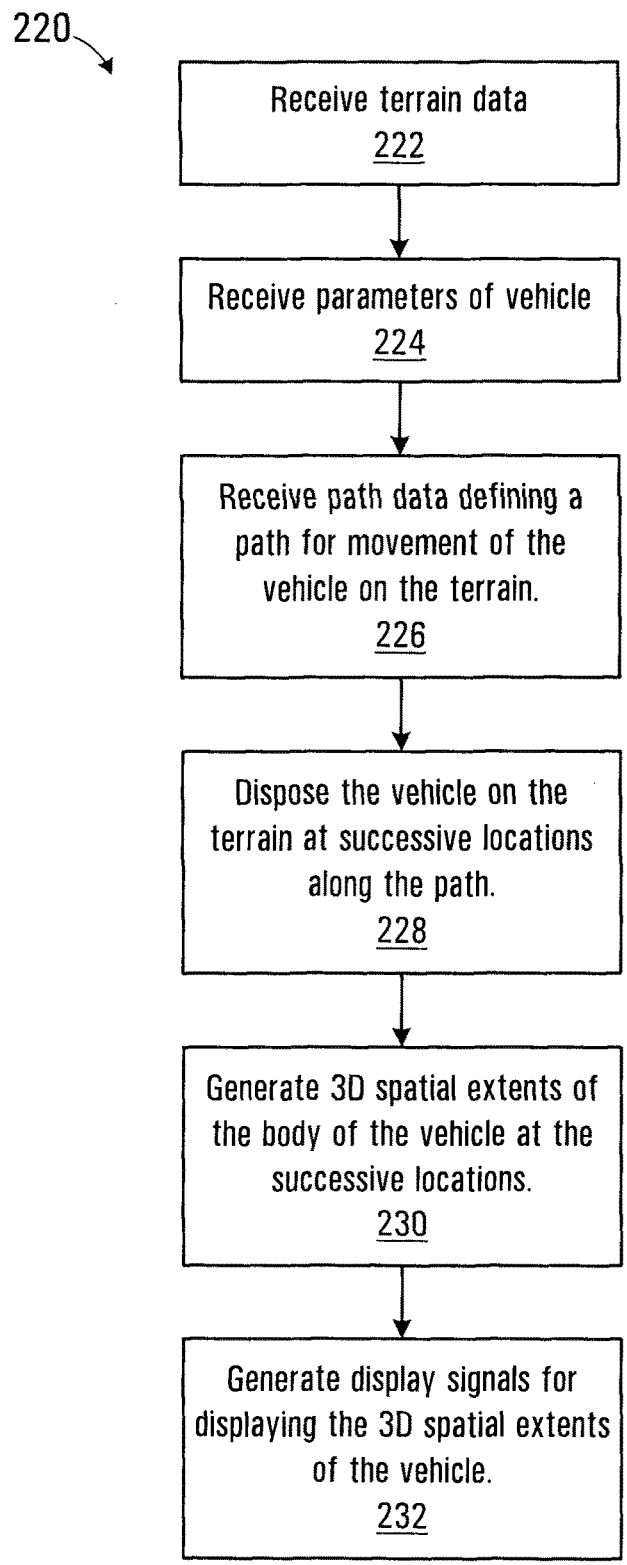
FIG. 3 is a flowchart depicting blocks of code for directing the processor circuit of FIG. 2 to carry out a process for generating the three-dimensional swept envelope of a vehicle.

Referring to FIG. 3, a flowchart depicting blocks of code for directing the processor circuit 150 to carry out a process for generating the three-dimensional swept envelope of a vehicle in accordance with one aspect of the invention is shown generally at 220. The blocks generally represent codes that may be read from the computer readable medium 180, and stored in the program memory 154 for directing the microprocessor 152 to perform various functions related to generating the 3D swept envelope of the vehicle. The actual code to implement each block may be written in any suitable program language, such as C++, for example.

Figure 4:
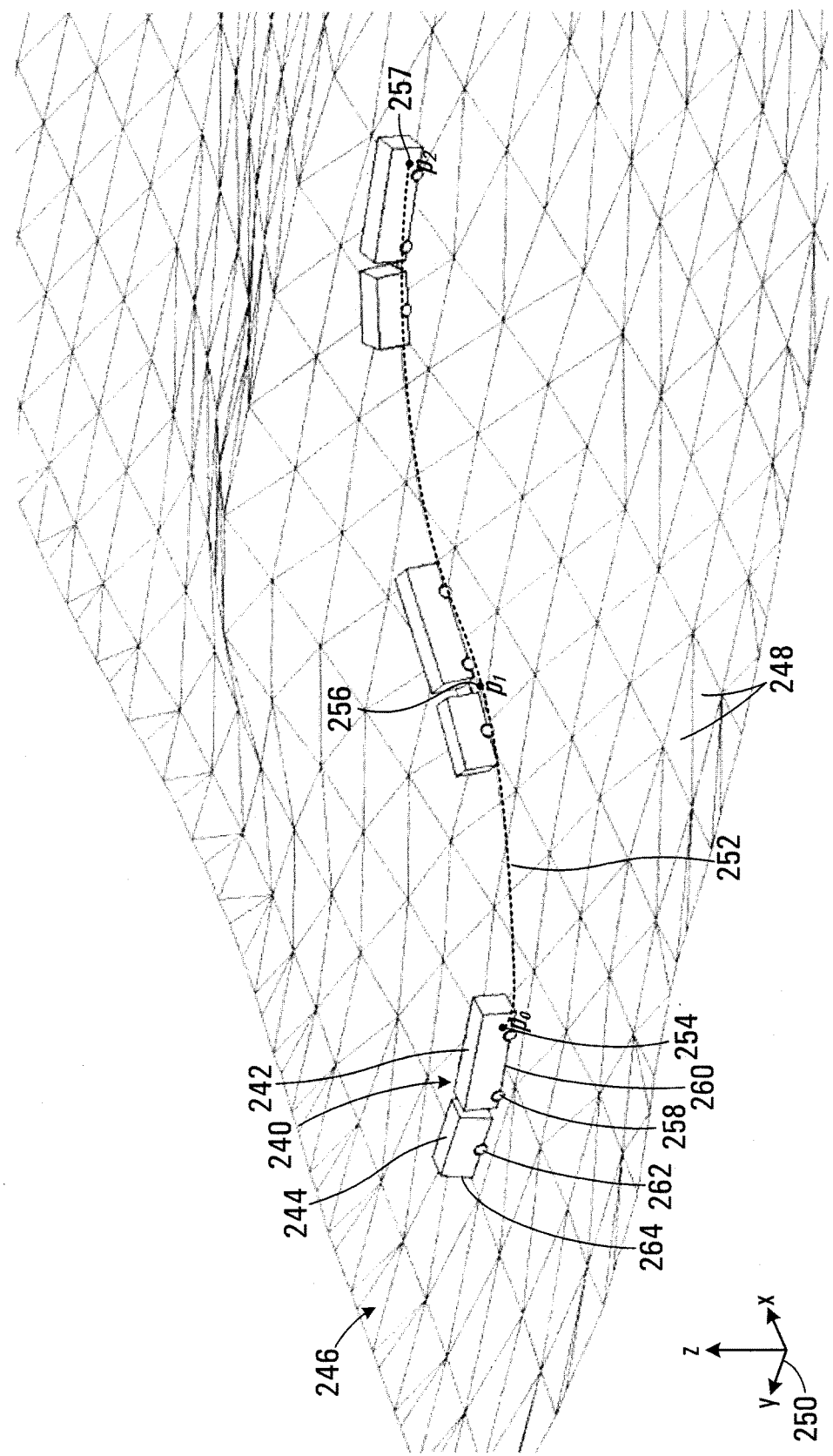
FIG. 4 is a representation of a vehicle supported on a terrain.

The process 220 begins at block 222, which directs the microprocessor 152 to receive terrain data defining a terrain. A vehicle 240 is shown supported on a terrain 246 in FIG. 4. Referring to FIG. 4, the terrain 246 is represented by a plurality of polygons 248 in a 3D coordinate space designated by XYZ axes 250. In this embodiment the vehicle 240, is an articulated bus having a tractor portion 242 and a trailer portion 244. Block 222 also directs the microprocessor 152 to store the terrain data in the terrain data store 200 of the variable memory 156 (shown in FIG. 2).

Referring back to FIG. 3, the process 220 then continues at block 224, which directs the microprocessor 152 to receive data defining parameters of the vehicle 240. The parameters of the vehicle 240 generally define aspects of placement and movement of the vehicle over the terrain 246, as described in more detail later herein. Block 224 also directs the microprocessor 152 to store the data defining parameters of the vehicle 240 in the vehicle database 202 of the variable memory 156 (shown in FIG. 2).

Block 226 then directs the microprocessor 152 to receive data defining a desired path for movement of the vehicle 240 from an initial position on the terrain 246 to a displaced position on the terrain. Referring to FIG. 4, in one embodiment receiving the path may involve receiving operator input from the pointing device 191 and/or keyboard 193 (shown in FIG. 2) defining a line 252 extending between an initial position 254 ($p_0$) of the vehicle 240 and a displaced position 256 ($p_1$). The point $p_0$ provides an initial position for the vehicle 240, and the direction of the line 252 provides an initial orientation of the vehicle. In other embodiments, the initial position and orientation may be otherwise specified by operator input. The path is represented by the line 252 and may include several additional displaced positions such as the positions 256 and 257 ($p_1$) shown in FIG. 4.

Block 228 then directs the microprocessor 152 to dispose the vehicle 240 on the terrain 246 at a plurality of successive locations along the path to generate a corresponding plurality of spatial extents of the vehicle body. The tractor and trailer portions 242 and 244 of the vehicle 240 each comprise a wheeled chassis, which is operable to support a body of the vehicle for movement along a terrain. In FIG. 4, the wheeled chassis of the tractor 242 is shown generally at 258 and the body of the tractor is shown at 260. Similarly the trailer 244 includes a wheeled chassis 262 and a body 264. Referring back to FIG. 3, the process of block 228 generally involves determining points of engagement between wheels of the wheeled chassis 262 and the terrain 246 to dispose the chassis with respect to the terrain and determining a corresponding 3D location of the body 260 of the vehicle with respect to the terrain.

Block 230 then directs the microprocessor 152 to generate a plurality of 3D spatial extents of the body of the vehicle 240 at the successive locations. The 3D spatial extents define the 3D swept envelope of the vehicle when moving from the initial position 254 to the displaced positions 256 and/or 257, as described in more detail below.

The process 220 then continues at block 232, which directs the microprocessor 152 generate signals at the first output 194 and/or second output 196 for displaying the 3D swept envelope on the display 108 or printing the 3D swept envelope on the printer 116.

The process of generating the 3D swept envelope shown in FIG. 3 is described below in greater detail.

Receiving Terrain Data

Figure 5:
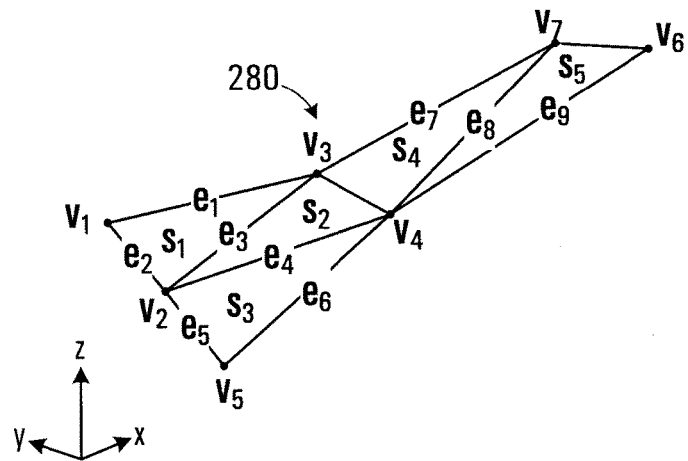
FIG. 5 is a portion of the terrain shown in FIG. 4.

As noted above, receiving terrain data at block 222 of the process 220 may involve receiving a plurality of polygons 248, which is commonly referred to as a polygon mesh. A portion of the polygon mesh terrain 246 is shown in FIG. 5 at 280. The surface portion 280 includes 5 polygons $s_1$ to $s_5$, which in this case are triangular polygons in a 3D coordinate space designated by XYZ axes 250. Advantageously, many graphic processors are optimized for processing triangular polygons, and representing a surface using triangular polygons may provide enhanced processing performance over other polygon representations such as rectangles, for example.

Each triangular polygon is defined by three vertices, and three edges. For example $s_1$ includes vertices $v_1$, $v_2$, and $v_3$ and edges $e_1$, $e_2$ and $e_3$. Commonly a polygon mesh may be represented by a plurality of tables, including a polygon table listing the polygons s and associated vertices v that make up each polygon, a vertex table listing x, y, and z coordinates of each vertex v, and an edge table listing the edges e and the associated vertices v that make up each edge. The edge table provides data that permits more efficient processing of the polygon mesh by eliminating multiple processing of common edges. One particular example of a polygon mesh format is the triangulated irregular network (TIN) surface, which comprises triangular polygons. Auto-CAD Civil 3D is able to read and process surfaces in the TIN format. AutoCAD also provides functions for displaying representations of TIN surfaces on a 2D display, as well as functions for shading and rendering the surfaces that make up the TIN surface. Alternatively, other surface representations such as a grid surface, which includes a sampled array of elevations for a number of ground positions at regularly spaced intervals, may be used.

The tables that define the polygon mesh surface 246 are stored in the terrain data store 200 of the variable memory 156 (shown in FIG. 2). Advantageously, the use of plane polygons facilitates representation of a 3D terrain surface on a 2D display, such as the display 108 shown in FIG. 1 and FIG. 2.

Vehicle Parameters

Figure 6:
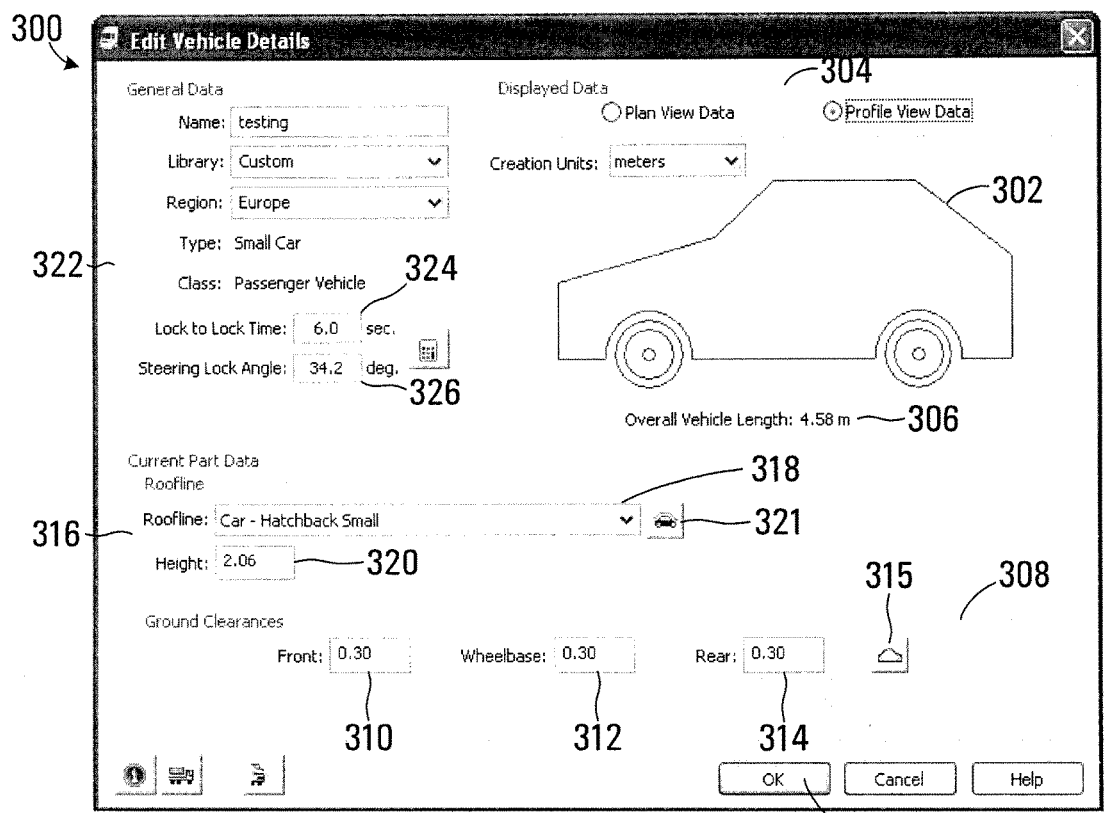
FIG. 6 is a screenshot of an operator interface for displaying and receiving operator input of vehicle parameters.

In one embodiment, the vehicle parameters are stored in the memory store 202 as a vehicle database, which includes sets of vehicle parameters for various vehicles. Block 224 of the process 220 shown in FIG. 3 would then additionally direct the microprocessor 152 to receive a vehicle selection from an operator and to read the vehicle parameters for a selected vehicle from the vehicle database 202. An exemplary operator interface for displaying and receiving operator input of vehicle parameters is shown at 300 in FIG. 6. Referring to FIG. 6, in this embodiment parameters for a small passenger vehicle 302 are displayed in the operator interface 300. In the embodiment shown, the vehicle 300 is shown in a simplified box outline, although in other embodiments further detail of the vehicle profile may be displayed to more realistically represent the vehicle. Simplification of the vehicle representation may advantageously reduce the amount of processing required by the microprocessor 152, since the simplified vehicle may be represented using a small number of geometrical shapes.

The various fields of the operator interface 300 are populated using values read from a small passenger vehicle from the vehicle database 202. The operator interface 300 includes a control 304 for selecting between a profile view and a plan view of the vehicle 302. In this embodiment a profile view is selected and displayed. The vehicle 302 has an overall length of 4.58 meters as indicated at 306. The operator interface 300 also includes a ground clearance group of input boxes 308, which includes fields for defining a front overhang ground clearance value 310, a wheelbase ground clearance value 312, and a rear overhang ground clearance value 314. The operator interface 300 also includes a button 315, which when actuated by the operator causes a further interface to be displayed for defining various chamfers to the profile of the vehicle 302 as shown in FIG. 6. Alternatively, in other embodiments (not shown) a bottom profile of the vehicle may be used to define the features of the vehicle 302 that are associated with ground clearance and the front overhang, rear overhang, and chamfer parameters may be omitted.

The operator interface 300 also includes a roofline group of input boxes 316, which includes a field 318 for selecting a roofline profile of the vehicle 302 and a field 320 for defining a height of the vehicle. The operator interface 300 also includes a button 321, which when actuated by the operator opens a further operator interface (not shown) for customizing the roofline of the vehicle.

The operator interface 300 further includes a group of input boxes 322, which include fields 324 and 326 for defining steering parameters associated with the vehicle 300. As noted above, the various fields in the operator interface are initially populated from standard vehicle data stored in the vehicle database 202. However the operator may alter certain values through the provided input boxes to make changes to the standard vehicle parameters as desired. The operator interface 300 also includes an "OK" button 328, which when actuated by the operator closes the interface 300. In other embodiments, the vehicle parameters may be otherwise received and saved in the database 202.

Figure 8A:
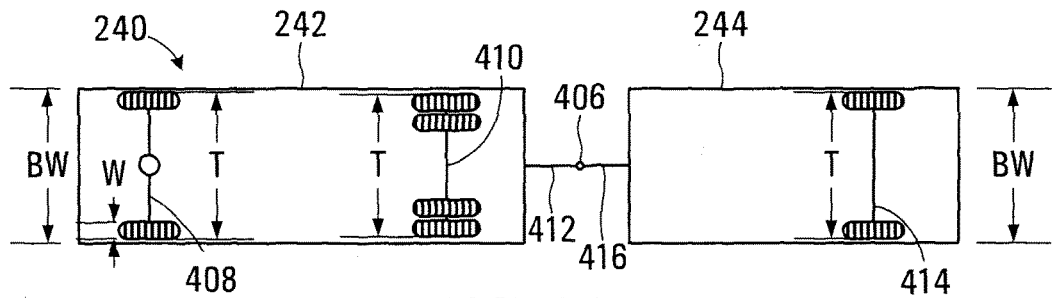
FIG. 8A is a plan view of a tractor-trailer vehicle.
Figure 8B:
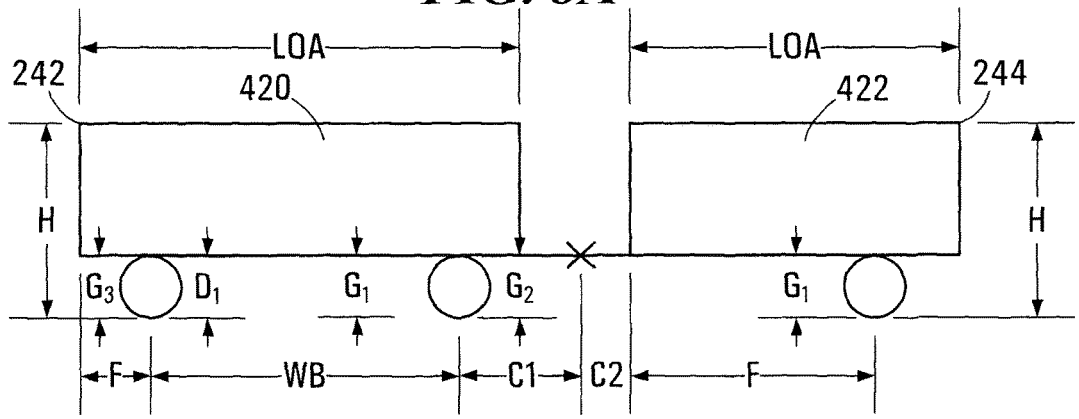
FIG. 8B is an elevational view of a tractor-trailer vehicle.

Exemplary vehicle parameters for the tractor-trailer vehicle 240 shown in FIG. 4, such as would be read from the vehicle database 202, are shown generally at 350 in FIG. 7. Referring to FIG. 8A, the tractor-trailer vehicle 240 is shown in plan view in FIG. 8A, and includes a tractor portion 242 and a trailer portion 244, which are coupled together at a coupling 406. The tractor portion 242 includes a front axle having 2 wheels, the front axle being steerable. The tractor portion 242 also includes a rear axle 410 having 4 wheels, which are not steerable. The tractor portion 242 further includes a trailer hitch 412. The trailer portion 244 includes a single rear axle 414 having 2 wheels and a coupling 416 for coupling to the trailer hitch 412 at the coupling 406. Referring to FIG. 8B, the tractor portion 242 of the vehicle 240 includes a body 420 and the trailer portion 244 includes a body 422, which are shown in profile view in FIG. 8B.

Various dimensions of the tractor portion 242 and trailer portion 244 included in the table 350 are shown in FIG. 8A and FIG. 8B. The table 350 includes a length overall (LOA) parameter 352, a front overhang (F) parameter 354, and a wheelbase (WB) parameter 356. A rear overhang measurement may be calculated by subtracting WB and F from the LOA parameter. The LOA, F, and WB parameters provide information defining the relative orientation between the chassis (i.e. the front axle, rear axle and wheels) and the body 420 of the tractor portion 242 and trailer portion 244.

The table 350 also includes ground clearance parameters 355 ($G_1$, $G_2$, and $G_3$) that respectively define front, wheelbase, and rear ground clearances as shown in FIG. 8B. The table 350 also includes a hitch overhang (C1, C2) parameter 358 that defines the location of the coupling 406 with respect to the chassis.

The table 350 also includes a front axle parameter 360 that defines the number of axles in the front axle group, a front axle wheels parameter 364 that defines the number of wheels on the axle, and a tire parameter that defines the diameter (D) and Width (W) of the tires. Some vehicles may have more than one front axle to carry a higher load. The table 350 also includes a front axle track (T) parameter 362 that defines the track dimension of the front wheels. In this embodiment, the track dimension 362 is the distance between outer edges of the tire tread measured across the axle. Conventionally, track dimensions generally refer to a distance between respective centers of the outer wheel tire tread, but for computing a 3D swept envelope the outside of the tire tread is more relevant. Accordingly, when populating the vehicle database 202, conventional track dimensions are adjusted to correspond to the distance between the outer edges of the tire tread measured across the axle. Similarly, the table 350 includes a rear axle parameter 368, rear axle track parameter 370, rear axle wheels parameter 372, and rear wheel tire diameter and width (D/W) 374.

The table 350 further includes a body width (BW) parameter 376, which defines an overall width of the body of the respective tractor portion 242 and trailer portion 244 and a body height (H) parameter 378, which defines the height of the body above the ground.

Figure 8C:
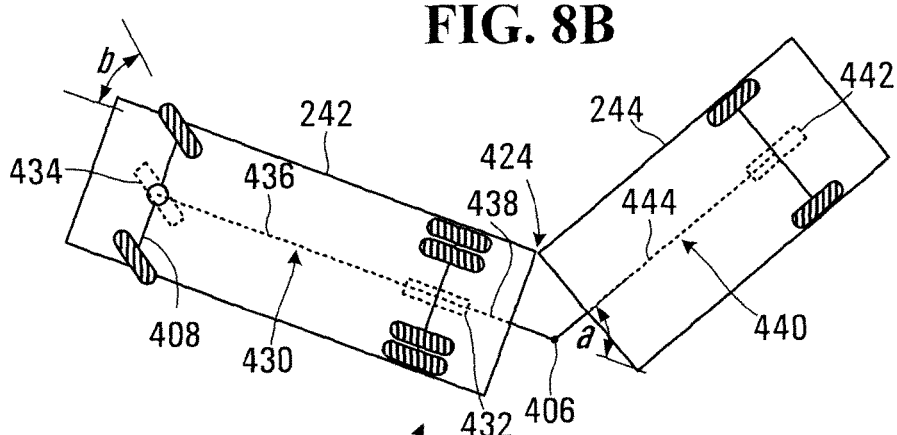
FIG. 8C is a further plan view of a tractor-trailer vehicle executing a turn.

The table 350 further includes an articulating angle parameter 380. In FIG. 8C the vehicle 240 is shown executing a turn. Referring to FIG. 8C, articulation of the vehicle 240 at the coupling 406 is constrained by interference between the respective vehicle bodies 420 and 422 at 424. In the embodiment shown, the articulating angle a is 70°.

Figure 8D:
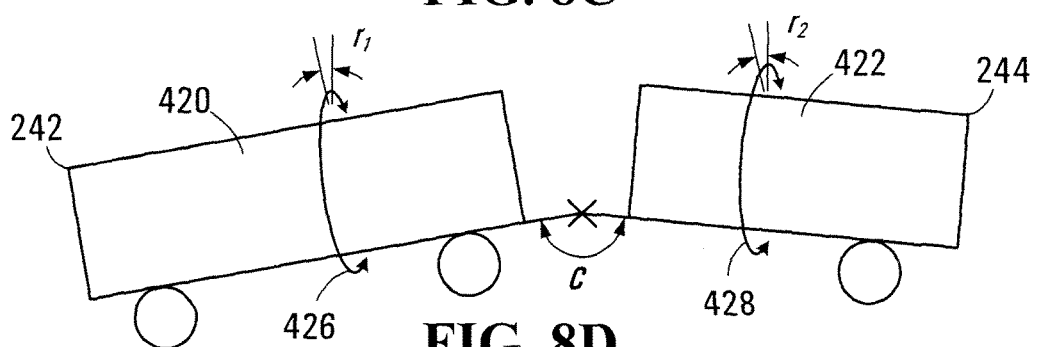
FIG. 8D is a further elevational view of a tractor-trailer vehicle.

The table 350 further includes a pitch parameter 382 and a roll parameter 384. Referring to FIG. 8D, the coupling 406 will also generally constrain pitching movements of the tractor portion 242 with respect to the trailer portion 244, and the pitch parameter 382 defines a maximum value of the pitch angle, shown in FIG. 8D as angle c. Similarly, the coupling 406 will also constrain rolling movements of the tractor portion 242 with respect to the trailer portion 244. Such rolling movements occur when the vehicle 240 moves over an uneven terrain. The rolling movement of the tractor portion 242 occurs in a direction indicated by the arrow 426 and results in a roll angle $r_1$ as shown in FIG. 8D. The rolling movement of trailer portion 244 occurs in a direction indicated by the arrow 428 and results in a roll angle $r_2$ as shown in FIG. 8D. For a locally uneven terrain, the angles $r_1$ and $r_2$ may not be equal and may be in opposite roll directions. The roll parameter 384 defines a maximum roll angle between tractor and trailer (i.e. $r_1+r_2$).

Finally, the table 350 also includes a steering lock angle (b) parameter 386 and a lock-to-lock time parameter 388 that define a behavior of the steerable wheels on the front axel 408. Referring back to FIG. 8C, the steering lock angle b defines the maximum angle of the wheels on the axel 408 through which the steering of the vehicle is capable of turning from a straight ahead condition. The lock-to-lock time is the time that an average driver of the vehicle 240 would take in turning the steering between opposite steering lock angles. In FIG. 8C, a bicycle model of the turning vehicle is also shown in broken outline at 430. The bicycle model 430 is used when generating the turning path of the vehicle, as described later herein.

Movement Path

As noted above, the path of the vehicle 240 may be defined in response to operator input received from the pointing device 191 and/or keyboard 193 (shown in FIG. 2). In one embodiment, operator input of a 2D arc is received via the pointing device 191 when actuated by the operator to indicate points such as points 254, 256, and for 257 on a 2D display of the terrain 246, such as shown in FIG. 4. The 2D arc is then projected onto the 3D terrain 246 to obtain the movement path 252 in the 3D coordinate space 250.

In receiving input of the movement path 252, the turning characteristics of the vehicle 240 may place minimum turn radius limitation on the movement path 252. In general the minimum turn radius is a function of the speed of the vehicle 240 and other vehicle turning parameters (for example the parameters 208 in FIG. 2 and/or the parameters 386 and 388 in the table 350 shown in FIG. 7). In one embodiment, the minimum turn radius may be computed in accordance with the formula:

$$R_{min} = \frac{v^2}{127\left(\frac{e}{100} + f\right)} \qquad \text{Eqn 1}$$

where:
$R_{min}$ is the minimum turn radius in meters;
v is the speed of the vehicle in kilometers per hour;
e is the superelevation of the terrain; and
f is a side friction factor.

The values of the turning parameters may provided by the operator through an operator interface (not shown). In this embodiment values of v, e, and f are stored in the turning parameters store 208 in the variable memory 156. The computed value of the radius $R_{min}$ may also be stored in the turning parameters store 208. Note that for units other than meters and kilometers, the values of the numerical constants in Eqn 1 would have to be modified accordingly. In other embodiments, a value for $R_{min}$ may be provided directly by operator input and stored in the turning parameters store 208.

If the operator provides input a point that attempts to define a movement path 252 which has a radius that is less than the $R_{min}$ (calculated from Eqn 1), block 226 of the process 220 shown in FIG. 3 may direct the microprocessor 152 to prohibit input of the point. Alternatively, the microprocessor 152 may be directed to generate a warning to alert the operator to the problem.

In other embodiments, the movement path may be predetermined. For example, in the case of a railway track the location of the tracks with respect to a terrain may be previously determined.

Moving the Vehicle Along the Movement Path

Moving the vehicle 240 along the movement path 252 requires steering of the steerable wheels of the vehicle to navigate the path. For the steerable tractor portion 242 of the vehicle 240 shown in FIG. 8, wheel locations along the path 252 may be determined using the bicycle model shown in FIG. 8C at 430 to represent the tractor portion 242 of the vehicle 240. The use of a bicycle model simplifies computation of wheel locations along the path 252, thereby providing improved computational efficiency. Referring back to FIG. 8C, the bicycle model 430 includes a front wheel 432 and a rear wheel 434, which are separated by a distance 436 corresponding to a wheelbase dimension of the tractor 242 (read from the WB field 356 in the table 350 of FIG. 7, which are also stored in the vehicle database 202 of FIG. 2). The front and rear wheels 432 and 434 are centered between the respective front and rear wheels of the tractor 242 (i.e. the front and rear wheels are each located at half of the respective track dimensions 362 and 370 shown in FIG. 7). In the embodiment shown, the front wheels of the tractor 242 are steerable and the corresponding front wheel 432 of the bicycle model 430 is also steerable, while the rear wheel 434 of the bicycle model is fixed. In other embodiments a vehicle may have steerable rear wheels, in place of or in addition to steerable front wheels, and the bicycle model may include a corresponding steerable rear wheel or steerable front and rear wheels. In the embodiment shown in FIG. 8C, the bicycle model 430 also includes a hitch portion 438 extending outwardly and ending in the coupling 406. The trailer portion 244 of the vehicle 240 may be similarly represented using the bicycle model 440, having a fixed rear wheel 442 separated by a wheelbase distance 444 from the coupling 406 and being operable to pivot about the coupling 406. The location of the coupling 406 is thus determined by the bicycle model 430, while the location of the rear wheel 442 of the trailer bicycle model 440 is determined with respect to the movements of the coupling 406.

Figure 9:
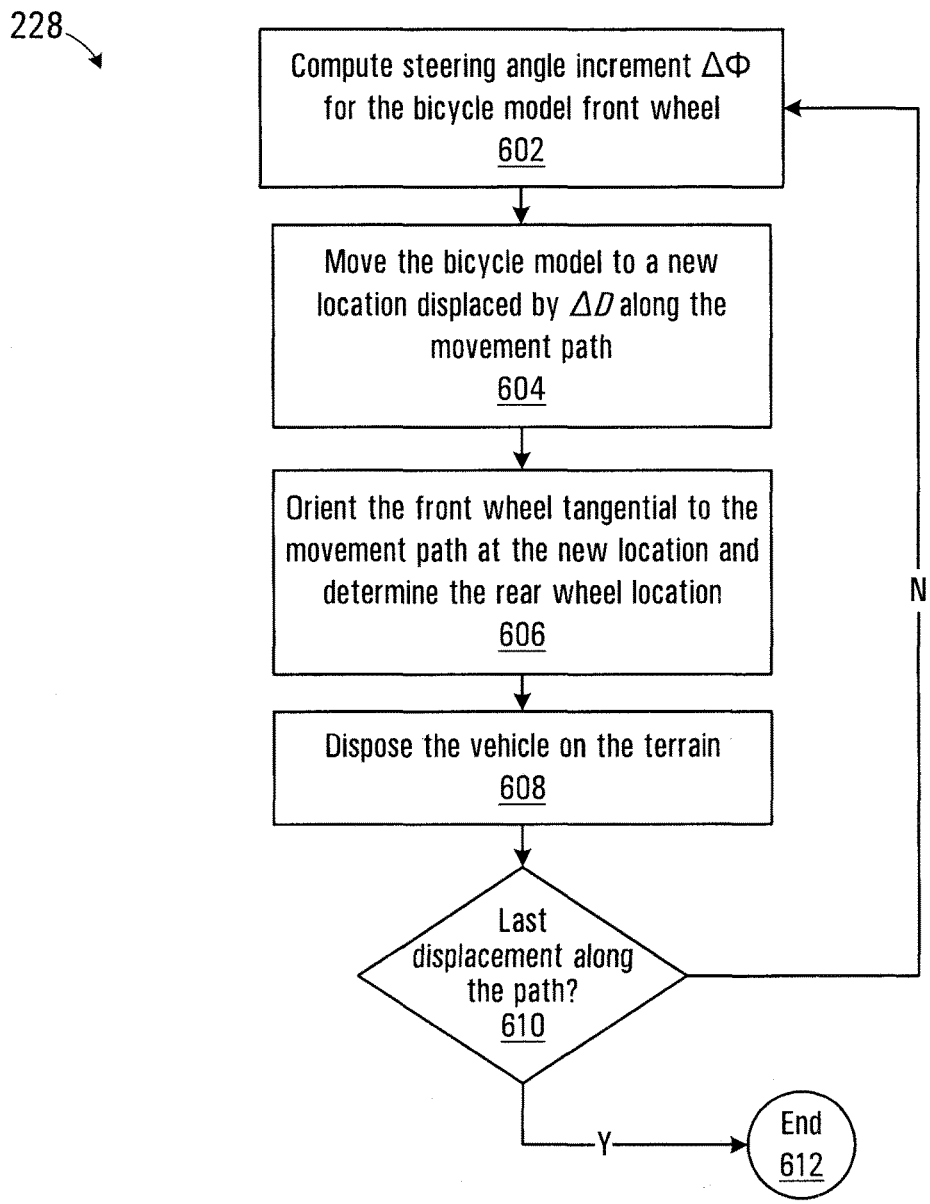
FIG. 9 is a flowchart depicting blocks of code for directing the processor circuit of FIG. 2 to carry out a portion of the process shown in FIG. 3.
Figure 10:
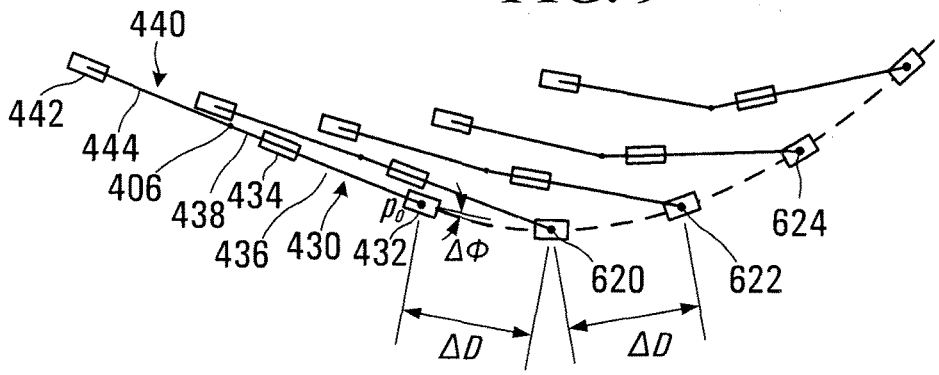
FIG. 10 is a plan view of a portion of a movement path shown in FIG. 4.

The process of block 228 shown in FIG. 3 for moving the vehicle along the movement path is shown in greater detail in FIG. 9. Referring to FIG. 9, the process 228 begins at block 602 which directs the microprocessor 152 to compute the steering angle increment Δφ at the first position $p_0$ along the path 252. A portion of the path 252 is shown in enlarged detail in FIG. 10. Referring to FIG. 10, in the embodiment shown the initial steering angle φ of the front wheel 432 of the vehicle is initially at 0°, although in other embodiments the initial steering angle may be non-zero. At point $p_0$ the steering angle increment Δφ is determined as the angle between the initial steering angle φ of the front wheel 432 of the bicycle model 430 and a line drawn tangent to the path 252.

Block 604 then directs the microprocessor 152 to move the bicycle model 430 along the path 252 by an increment of ΔD to a new location 620 on the path 252. In one embodiment ΔD may be about 100 mm.

The process then continues at block 606, which directs the microprocessor 152 to orient the bicycle model with the front wheel 432 tangential to the path at the location 620. The front wheel 432 thus follows the path 252, while the rear wheel 434 takes up a location corresponding to the incremented steering angle Δφ of the front wheel. The determined locations of the front and rear bicycle model wheels are saved in the bicycle model wheel location store 212 in the variable memory 156 shown in FIG. 2.

Block 608 then directs the microprocessor 152 to dispose the vehicle on the terrain. The process executed in block 608 will be described in more detail below.

Block 610 then directs the microprocessor 152 to determine whether the last displacement AD along the path has been reached. If at block 610, further displacements remain, then block 610 directs the microprocessor 152 back to block 600 and blocks 600-610 are repeated for successive new locations such as locations 622 and 624. If at block 610, no further displacements remain to be processed, then the process ends at 612.

Accordingly, for any location of the bicycle model 430 the parameters in table 350 may be used to determine corresponding locations of the wheels of the tractor 242. For example, the front left hand wheel of the tractor 242 is spaced apart from the front wheel 432 of the bicycle model by half of the track width dimension 362 in a direction perpendicular to the wheelbase. Locations of other wheels, such as the right hand rear wheel, may be similarly computed using the vehicle parameters in table 350. In FIG. 10, corresponding wheel locations may be similarly generated for the bicycle model 440 representing the trailer portion 244 by moving the bicycle model of the trailer 244 with respect to the hitch 438 as described above. For the trailer portion bicycle model 440, the hitch 438 of the tractor portion bicycle model 430 determines movement of the coupling 406, which in turn determines the movement of the bicycle model 440 an thus the location of the rear wheel 442.

The process 228 thus provides a plurality of locations for the front wheel 432 and the rear wheel 434 of the vehicle 240 as the vehicle is steered along the path. At each location 620, 622, 624 etc along the path 252, block 608 directs the microprocessor 152 to dispose the vehicle on the terrain, as noted above.

Disposing the Vehicle on the Terrain

Figure 11:
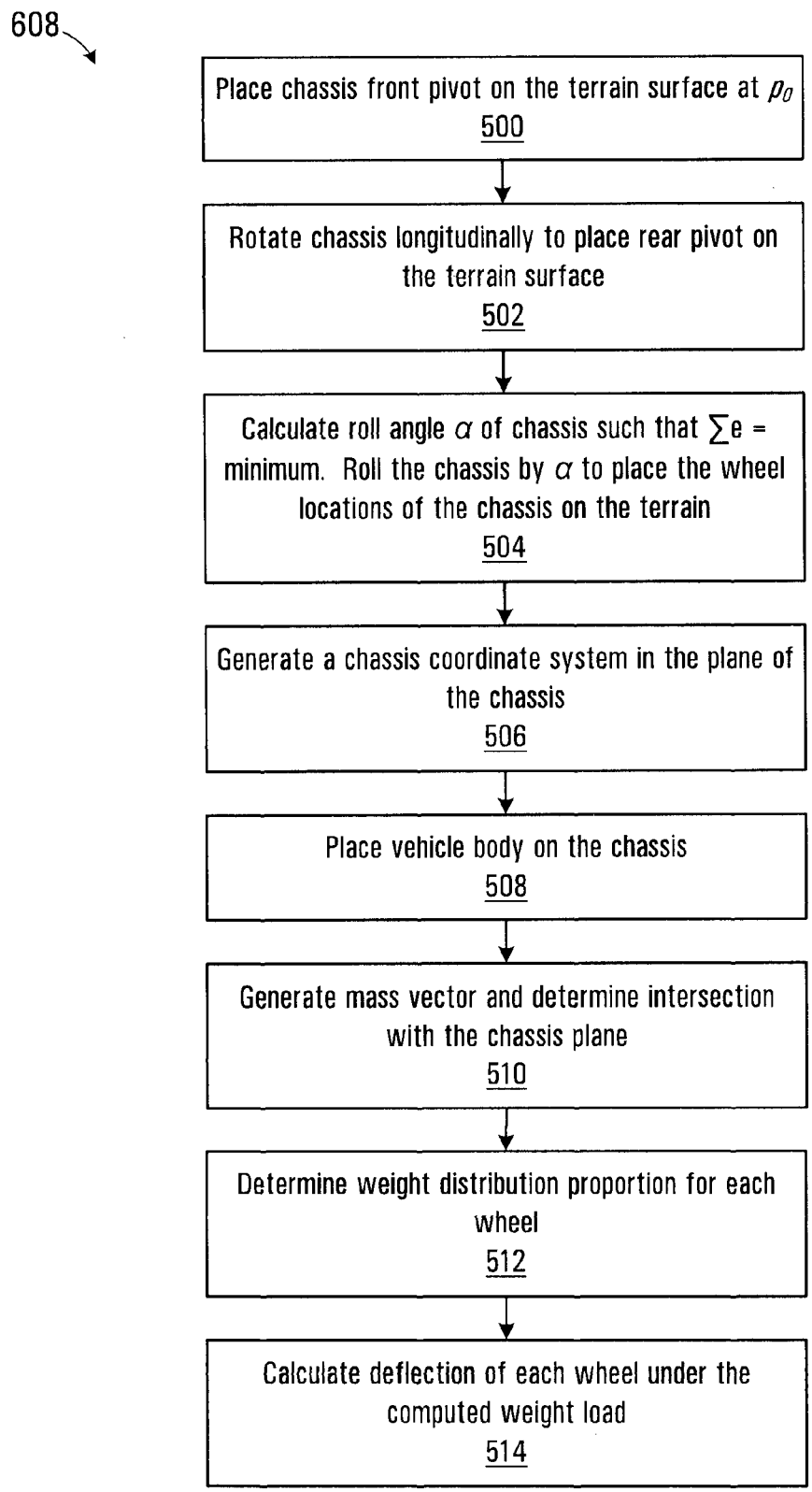
FIG. 11 is a flowchart depicting blocks of code for directing the processor circuit of FIG. 2 to carry out a portion of the process shown in FIG. 9.
Figure 12:
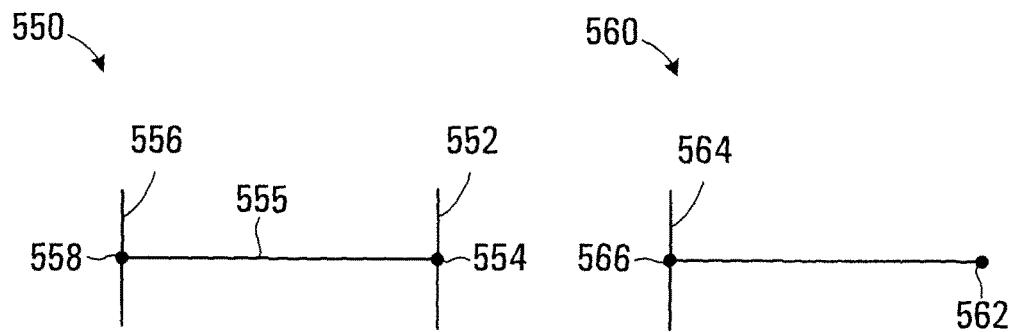
FIG. 12 is a plan view of a simplified representation of a chassis.

The process of block 608 is shown in greater detail in FIG. 11. Referring to FIG. 11, the process 608 begins at block 500, which directs the microprocessor 152 to place the chassis on the surface of the terrain at the initial position 254 (i.e. at point $p_0$ in FIG. 4). In general, a vehicle such as the vehicle 242 may be simply represented by a chassis and a body. Referring to FIG. 12, the chassis may be represented using a simplified "I" shaped chassis model shown at 550. The chassis 550 includes a front axel 552 having a front pivot 554 located at a center of the front axel, and a rear axel 556 having a rear pivot 558 located at a center of the rear axel. The location of the front pivot 554 corresponds to the location of the bicycle model front wheel 432 and the location of the rear pivot 558 corresponds to the location of the bicycle model rear wheel 434. The front and rear pivots 554 and 558 are used as a reference point for disposing the vehicle 240 on the terrain 246 at the bicycle model front and rear wheel locations determined during execution of the process 228 in FIG. 9.

The axels 552 and 556 are represented by respective lines separated by a line 555, which has a length corresponding to a wheelbase of the vehicle (i.e. parameter 356 in the table 350 shown in FIG. 7). Wheel locations on the chassis 550 are represented by the ends of the axel lines 552 and 556. Similarly, a trailer chassis model 560 includes a coupling 562, which acts as a front pivot, a rear axel 564, and a rear pivot 566 located at a center of the rear axel. Wheel locations of the trailer chassis 560 are also represented by the ends of the axel line 564.

Figure 13:
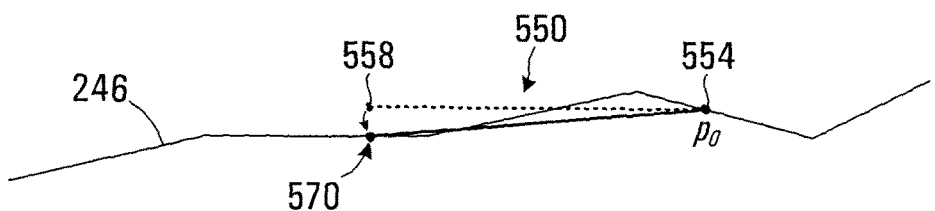
FIG. 13 is a cross sectional profile of a portion of the terrain shown in FIG. 4.

A portion of the terrain 246 taken generally along the path 252 in proximity to the initial position 254 ($p_0$) is shown in cross sectional profile in FIG. 13. The front pivot 554 is placed at point $p_0$ on the surface of the terrain 246 and the chassis 550 is initially horizontally oriented with respect to the terrain, as shown in broken outline in FIG. 13.

Figure 14:
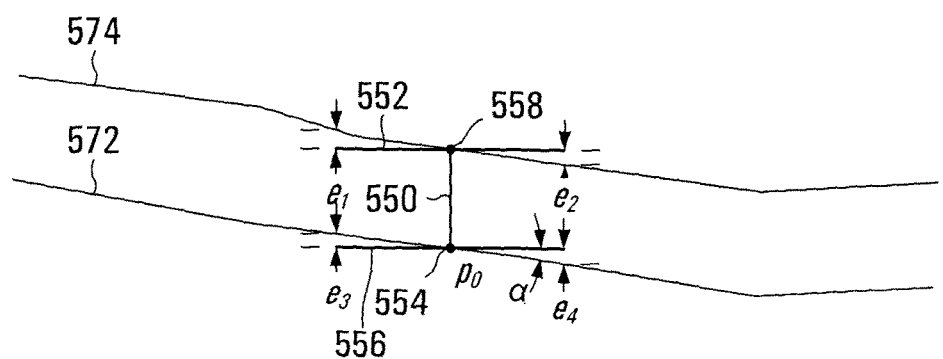
FIG. 14 is a front profile of a portion of the terrain shown in FIG. 4.

The process 608 then continues at block 502, which directs the microprocessor 152 to rotate the chassis 550 longitudinally to place the rear pivot 558 on a surface of the terrain 246, as shown in solid outline in FIG. 13. The chassis 550 is thus placed longitudinally on the surface along the line 246. However, at this time the plane of the chassis 550 into the page in FIG. 13 is still horizontally oriented and has not yet been laterally rolled to place the wheel locations on the terrain. This condition is shown in FIG. 14, where the chassis 550 is shown in front view and the wheel locations are not yet placed on the terrain. Referring to FIG. 14, the terrain 246 in proximity to the wheel locations is represented by two contour lines 572 and 574. The front pivot 554 is on the contour line 572 and the rear pivot 558 is on the contour line 574, and the wheel locations are displaced from the terrain by distances $e_1$, $e_2$, $e_3$ and $e_4$ respectively as shown. The distances $e_1$ to $e_4$ are determined constructing respective lines through each of the wheel locations on the chassis 550 that are perpendicular to the plane of the chassis and then finding the intersection point of the respective lines with the surface of the terrain 246. The distances $e_1$ to $e_4$ are then each calculated along the line between the wheel location and the intersection point with the surface of the terrain 246.

The process 608 then continues at block 504, which directs the microprocessor 152 to calculate a roll angle α of the chassis that minimizes:

$$\sum_{n=1}^{4} e_n \qquad \text{Eqn 2}$$

where $e_n$ are the respective wheel location displacements. Block 504 then further directs the microprocessor 152 to laterally roll the chassis 550 by the resulting roll angle α, thus placing the wheel locations proximate the surface of the terrain 246. It should be appreciated that since the terrain will generally not be planar over a region supporting the chassis 550, only in certain circumstances will all four wheel locations be on the terrain. At this point, effects of the vehicle suspension have not yet been taken into account.

Figure 15:
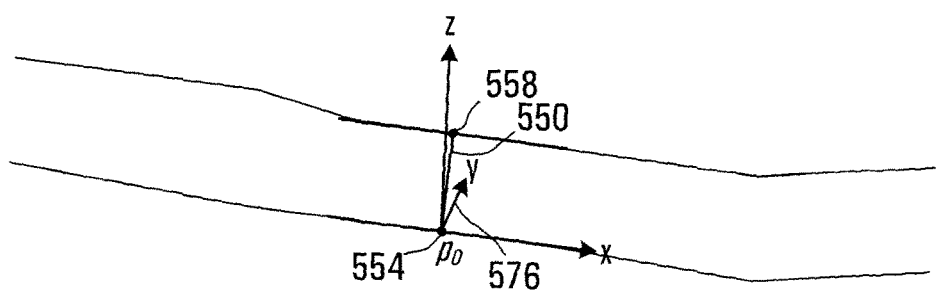
FIG. 15 is a further front profile of a portion of the terrain shown in FIG. 4.

Block 506 then directs the microprocessor 152 to generate a chassis coordinate system oriented such that the x and y axes define a plane that is co-planar with the pane of the chassis 550. Referring to FIG. 15, the x, y, and z axes of the chassis coordinate system are shown generally at 576. Effects of a suspension of the vehicle are accounted for by assuming that the wheel locations are able to move with respect to the chassis 550 in the direction of the z axis of the chassis coordinate system 576, such that the direction of operation of the suspension is dependent on the orientation of the chassis.

Figure 16:
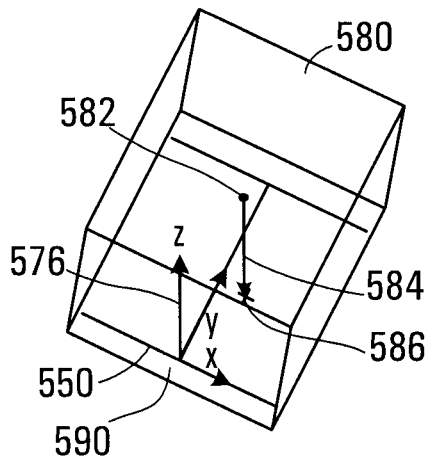
FIG. 16 is a perspective view of the chassis shown in FIG. 12 and a vehicle body placed on the chassis.

Block 508 then directs the microprocessor 152 to dispose the vehicle body on the chassis 550. In this regard the front overhang parameter 354 and overall length 352 from the table 350 in FIG. 7 provides sufficient information for locating the body longitudinally with respect to the chassis 550, while the body is assumed to be laterally centered with respect to the track of the front and rear axles. Referring to FIG. 16, a simplified body 580 is shown disposed on the chassis 550. The body 580 has a lower surface 590 that is located in the xy plane of the chassis coordinate system 576.

The process 608 then continues at block 510, which directs the microprocessor 152 to generate a mass vector for the body 580. The body 580 has a center of mass 582. The center of mass of a body is location that is fixed in relation to the body. In one embodiment the center of mass location may be assumed to be centered with respect to a base of the body 580 and vertically located at ⅓ of the height of the body. Alternatively, for more complex roofline profiles the center of mass may be computed using other methods, for example by dividing the body into a number of solids and combining the respective center of mass locations for the various solids to yield an overall center of mass for the body. Block 510 further directs the microprocessor 152 to construct a vector 584 extending vertically downward from the center of mass 582 to intersect the xy chassis plane at a point 586.

Figure 17:
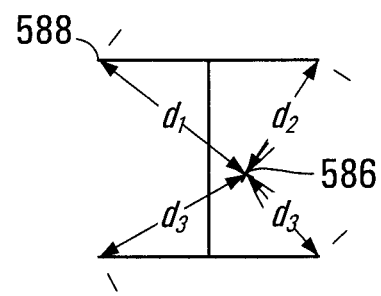
FIG. 17 is a further plan view of the simplified representation of a chassis shown in FIG. 12.

Block 512 then directs the microprocessor 152 to compute the weight distribution between the four wheel locations of the chassis 550. Referring to FIG. 17, in the embodiment shown, the weight distribution is computed on the basis of the distances $d_1$ to $d_4$ between the point 586 and each respective wheel location. For example, the weight at each wheel location may be determined by solving for x in Eqn 3 below:

$$\frac{x}{d_1} + \frac{x}{d_2} + \frac{x}{d_3} + \frac{x}{d_4} = 1 \qquad \text{Eqn 3}$$

where $d_1$ to $d_4$ are the distances shown in FIG. 17 and, the weight at each wheel location is given by:

$$W(n) = \frac{x}{d_n} \qquad \text{Eqn 4}$$

where n=1.4 and $d_n$ is the respective distance $d_1$ to $d_4$.

In other embodiments, the simple approach described above in connection with FIG. 17 and equations 3 and 4 may be replaced by an algorithm for computing the weight distribution based on torsional, acceleration, deceleration and centripetal considerations, for example.

The process 608 then continues at block 514, which directs the microprocessor 152 to calculate the deflection of the suspension associated with each wheel under the weight load calculated at block 512. In the embodiment shown, effects of the suspension of the vehicle is accounted for by assuming each wheel location to have an associated spring that extends between the body 580 and the chassis 550 and provides a limited maximum deflection in the direction of the z-axis. In one embodiment the maximum deflection of the spring is taken as 150 mm for all vehicles, however in other embodiments the maximum deflection may be included in the vehicle parameters in table 350 of FIG. 7. For each wheel location on the chassis 550, the deflection may be calculated from:

$$h_n = G - \frac{W_n}{k} \qquad \text{Eqn 5}$$

where $W_n$ is the weight proportion acting at the wheel location calculated from equation 4;

G is the ground clearance at the wheel location from table 350; and k is the spring constant for the suspension spring.

If the calculated $h_n$ from Eqn 5 is greater than the maximum deflection (e.g. 150 mm), then block 514 directs the microprocessor 152 to set the deflection to the maximum deflection. The deflection calculated at each wheel location defines the height of the body 580 above the surface of the terrain 246 at each of the respective wheel locations. Block 514 further directs the microprocessor 152 to generate a body coordinate system defining the location of the vehicle body with respect to the terrain 246.

For some types of terrain that have larger local curvature or depressions, one of the wheels may reach the maximum deflection condition without being in contact with the terrain leaving the vehicle supported on three wheels. In this condition the location of the chassis 550 and hence the body 580 would thus be defined by the remaining wheels that are in contact with the terrain. In other embodiments torsion may be taken into account for large terrain curvatures and/or depressions to more realistically simulate the placement of the vehicle on the terrain by permitting twisting of the chassis and body and the mechanical connectors and suspension components linking the two.

The trailer 244 may be disposed on the terrain by using the trailer chassis model 560 and by implementing a similar process to the process 608, except that in the case of the semi trailer shown in FIG. 12 there are only three points to work with, i.e. the coupling 562 or front pivot, and the left wheel and right wheel on the rear axle 564. The positioning in this case is simplified, since the trailer is connected to the coupling 406 of the tractor, which defines precisely in 3D space a location for the front pivot. In the case of a full trailer (i.e. a trailer having two spaced apart axels having wheels that fully support the trailer), the process 608 may be used in the same way as it is used to dispose the tractor portion of the vehicle on the terrain.

In one embodiment the weight at the coupling 406 due to the trailer load is neglected in calculating the center of mass 582 of the tractor body. However, in other embodiments where the weight load on the coupling 406 is significant, the center of mass 582 may be offset to account for this additional load. In embodiments where there are multiple axels in an axel group, the chassis may still be modeled using a single axel, however there would be some loss of realism when the associated wheels traverses a bump on the terrain, such as a speed bump.

Referring back to FIG. 8, once the tractor portion 242 and trailer portion 244 of the vehicle 240 are both deposed on the terrain, the angle c in FIG. 8C is calculated at checked against the maximum pitch parameter 382. A difference between the roll angles $r_1$ and $r_2$ is also calculated and the resulting roll angle is checked against the maximum roll parameter 384. The processor circuit 150 may be further operably configured to cause an error condition to be generated, should the calculated pitch and roll angles exceed the values defined for the vehicle in table 350 at 382 and 384.

Advantageously, by simplifying the chassis model 550 and accounting for the suspension using a heuristic model as described above, computational efficiency is enhanced thereby making it possible to have the system interact in real time with the operator without any significant computational delay. In other embodiments the processing performance of the processor circuit 150 may be further enhanced to facilitate use of a more complex model of the vehicle including more realistic linkages between the vehicle and body. The more realistic model may facilitate more accurate placement of the vehicle 240 on the terrain 246. For example, the chassis model 550 and the linkage to the body 580 may account for other kinematic considerations such as torsion of the body/chassis and mechanical connectors of the suspension system that couple the suspension to the body and the chassis.

Generate 3D Swept Path

Figure 18:
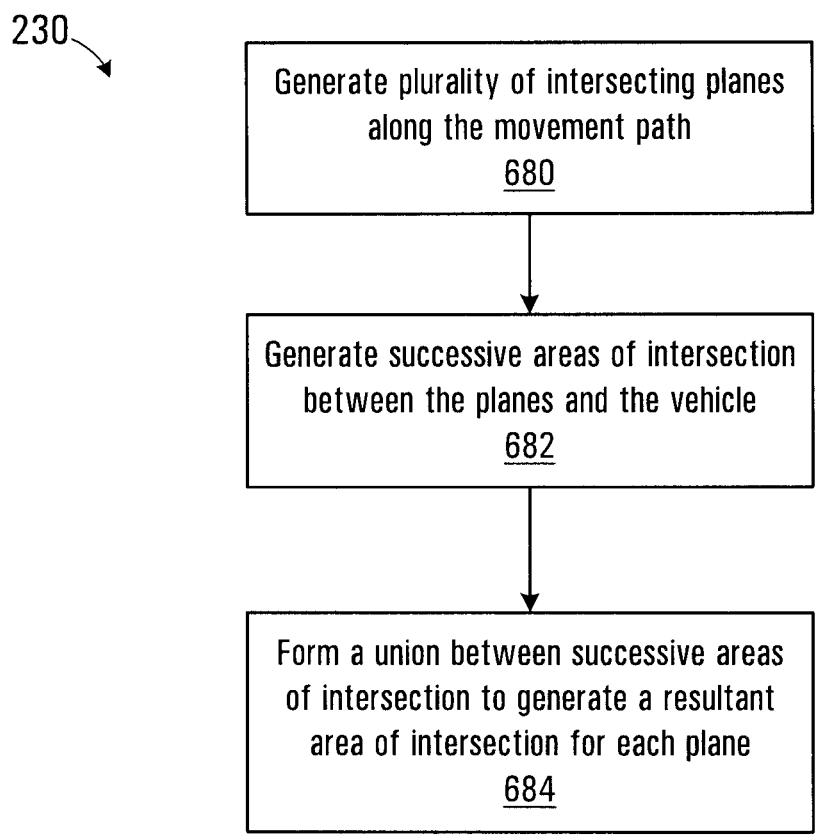
FIG. 18 is a flowchart depicting blocks of code for directing the processor circuit of FIG. 2 to carry out a further portion of the process shown in FIG. 3.
Figure 19:
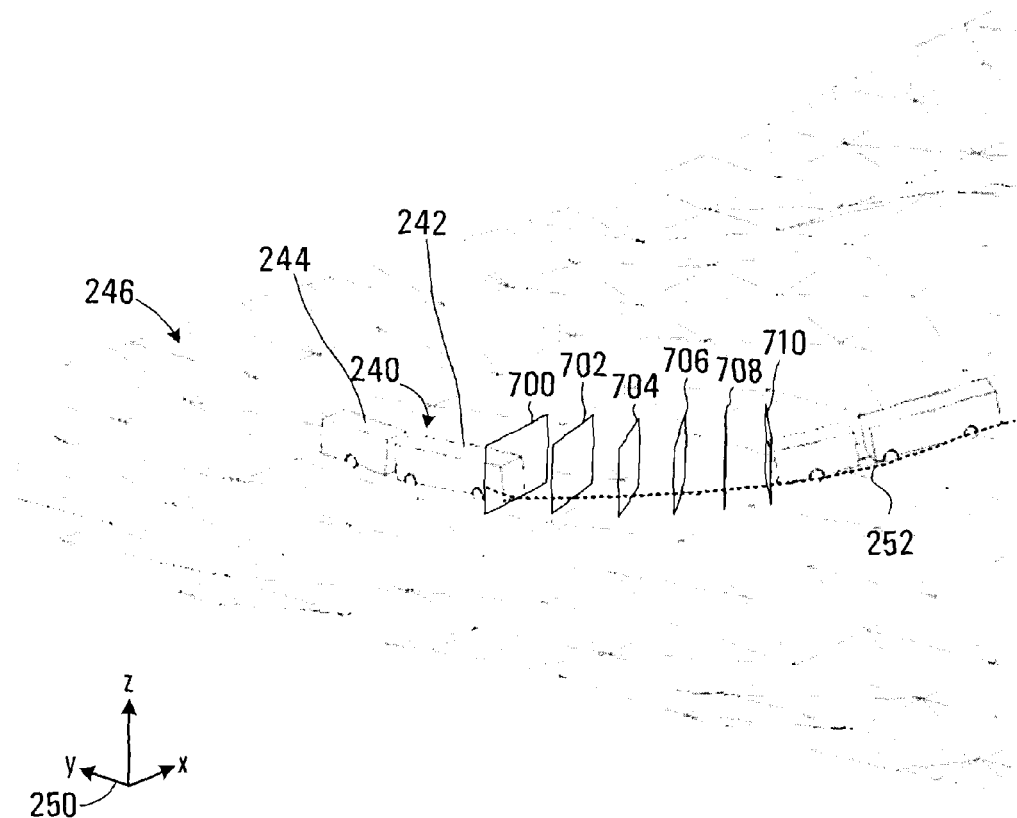
FIG. 19 is a further representation of the vehicle and terrain shown in FIG. 4.

When executed by the microprocessor 152, the process 228 results in the vehicle 240 being steered over the terrain 246 along a 3D path 252, thereby tracing out a 3D path of the body of the vehicle across the terrain. The 3D swept path of the vehicle is defined by the spatial extents of the body of the vehicle. The process of block 230 for generating the spatial extents and the swept path is shown in greater detail in FIG. 18. Referring to FIG. 18, the process begins at block 680, which directs the microprocessor 152 to generate a plurality of intersecting planes along the movement path 252. A portion of the terrain 246 is shown in FIG. 19, with a plurality of intersecting planes shown at 700, 702, 704, 706 etc. In one embodiment the planes 700-706 may be disposed spaced apart by the same spacing increment ΔD used in the process 228 of FIG. 9. Each intersecting plane 700-710 is oriented perpendicular to the movement path 252.

Figure 20:
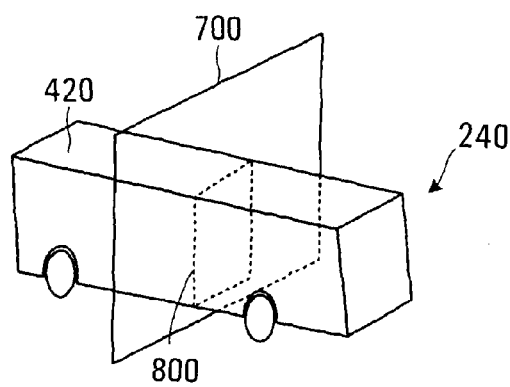
FIG. 20 is a perspective view of an intersection of a vehicle with an intersecting plane.

Block 682 then directs the microprocessor 152 to generate an area of intersection between the body of the vehicle 240 and each intersecting plane 700-710 as the vehicle 240 is moved along the path 252 as described above in connection with the process 228 of FIG. 9. Referring to FIG. 20, the vehicle 240 is shown moving through the plane 700 to generate an area of intersection 800 between the vehicle body 420 and the intersection plane. For each successive displacement of the vehicle 240 along the movement path 252, the area of intersection 800 may change.

Figure 21A:
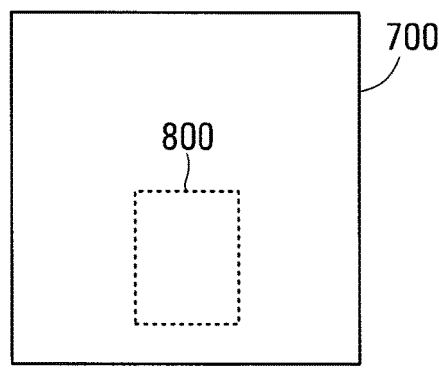
FIG. 21 is series of schematic representations of the intersection plane shown in FIG. 20.
Figure 21B:
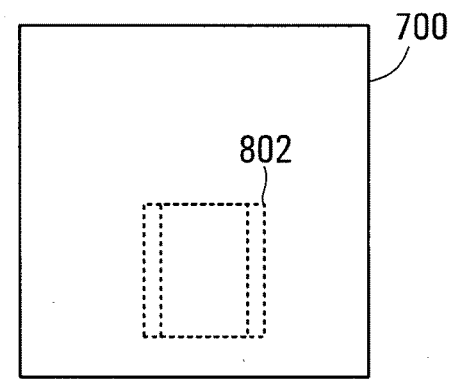
Figure 21C:
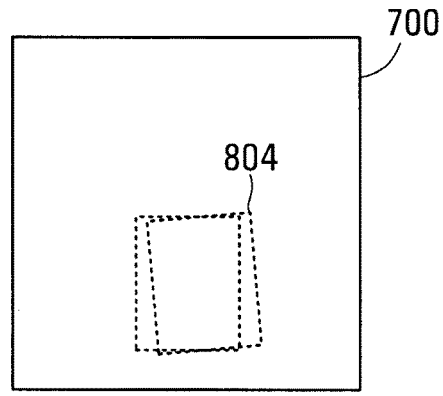
Figure 21D:
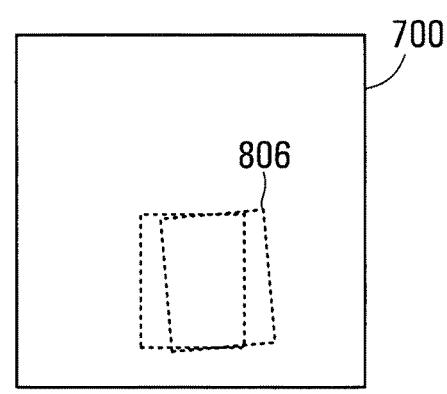

Referring to FIG. 21A to FIG. 21D, the area of intersection 800 for successive displacements of the vehicle shown in FIG. 20 are shown in plan schematic view. In FIG. 21A the first area of intersection 800 is generally rectangular and corresponds to the cross-sectional shape of the vehicle 240. In FIG. 21B, the vehicle 240 has moved over to the right, due to the steering and off-tracking of the vehicle along the path defining an area of intersection 802. In FIG. 21C the vehicle has rolled to the right, for example due to a local depression in the terrain, defining an area of intersection 804. In FIG. 21D the vehicle has further moved to the right defining an area of intersection 806. Block 682 directs the microprocessor 152 to accumulate the areas of intersection 800-806 shown in FIGS. 21A-D and to store data defining the intersection areas in the store 210 of the variable memory 156.

For the simple body of the vehicle 240 shown in FIG. 20, the area of intersection 800 is computed as a simple intersection between the rectangular cross-section body 420 and the plane 700. In other embodiments, vehicles having a more complex roofline profile may be split into several 3D geometric shapes, each having a simple shape such as a rectangle, wedge or other shape that permits efficient computation of the intersection area.

Figure 22:
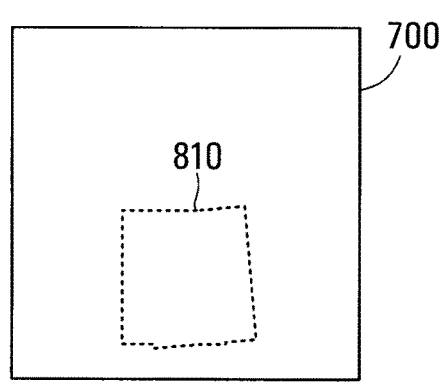
FIG. 22 is schematic representation of a union of the intersection planes shown in FIG. 21.

The process then continues at block 684, which directs the microprocessor 152 to form a union of the intersecting areas 800-806. Referring to FIG. 22, the union of the four areas of intersection shown in FIG. 21A-D are shown at 810 in FIG. 22.

Figure 23:
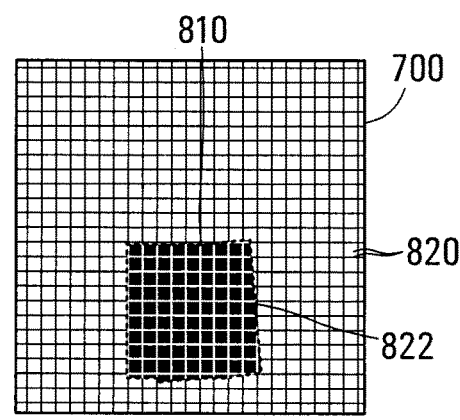
FIG. 23 is schematic representation of a union of the intersection planes shown in FIG. 21, in accordance with an alternative embodiment.

In one embodiment the intersection with the plane 700 may be computed on a raster basis by defining a plurality of raster elements 820 extending over the plane 700. Each intersection 800-806 in FIG. 21A-D would then be processed to determine which raster elements 820 are within the intersection area (i.e. black raster elements 822 in FIG. 23), and which remain outside the intersection area (i.e. the white raster elements in FIG. 23). After each of the successive intersections has been raster processed the black raster elements define the union of the intersection areas 800-806. The intersection area may be stored as a raster map in the store 210 of the variable memory 156. The raster outline may be subsequently converted back into a vector based intersection outline for printing of the printer 116 or for display on the display 108 shown in FIG. 1 and FIG. 2.

Figure 24:
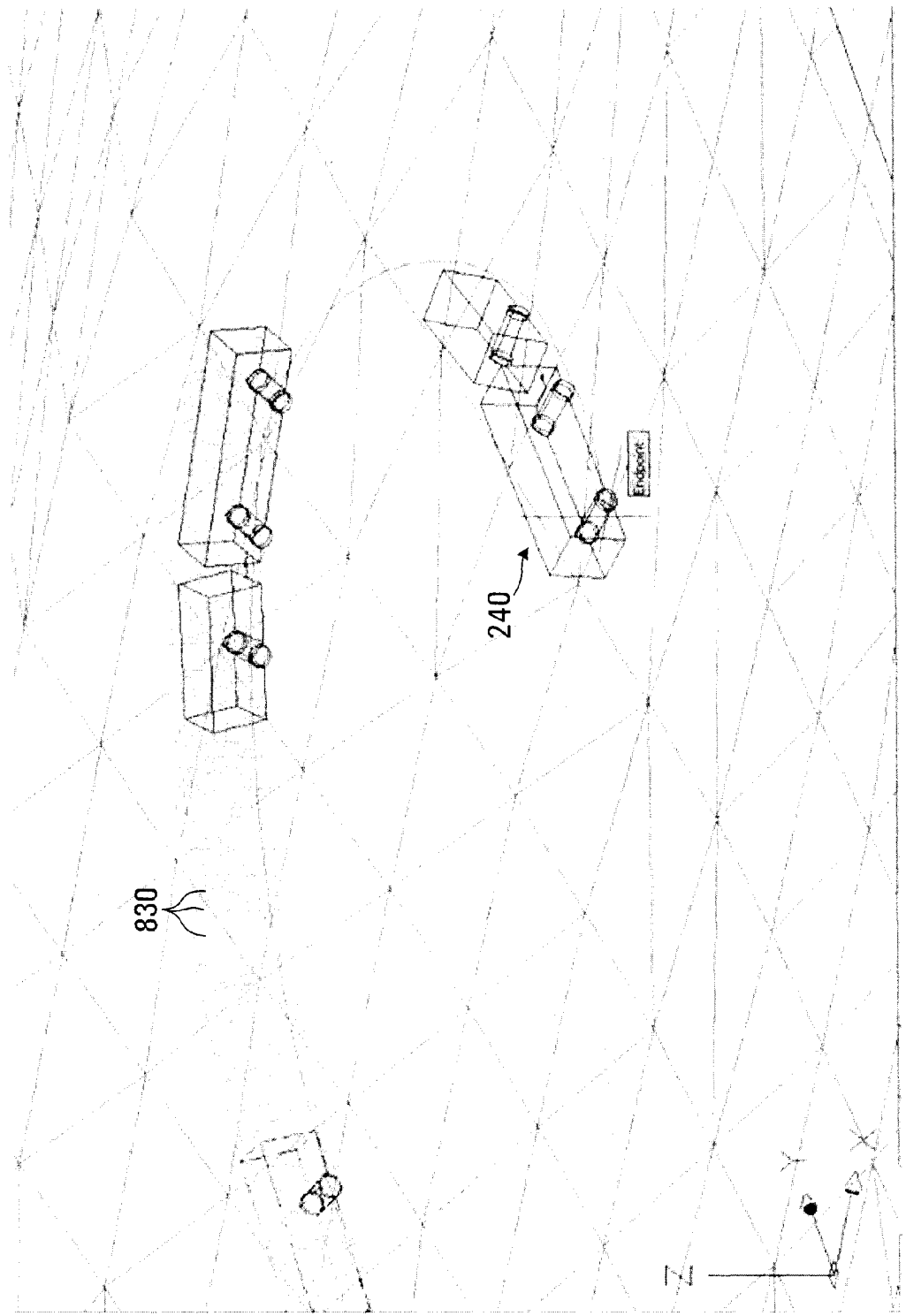
FIG. 24 is a displayed representation of a 3D swept envelope generated by the processor circuit shown in FIG. 2.

When the vehicle 240 has moved along the length of the movement path 252, the resulting intersection areas for each plane 700-710, such as the intersection area 810 for the plane 700, define the spatial extents of the body 420 of the vehicle 240. Referring to FIG. 24, a plurality of intersection areas for the vehicle 240 are shown generally at 830. In the embodiment shown, the intersection areas 830 have been combined to form a wireframe mesh (similar to the mesh used to represent the terrain) which extends along the 3D swept path of the vehicle 240.

Figure 25:
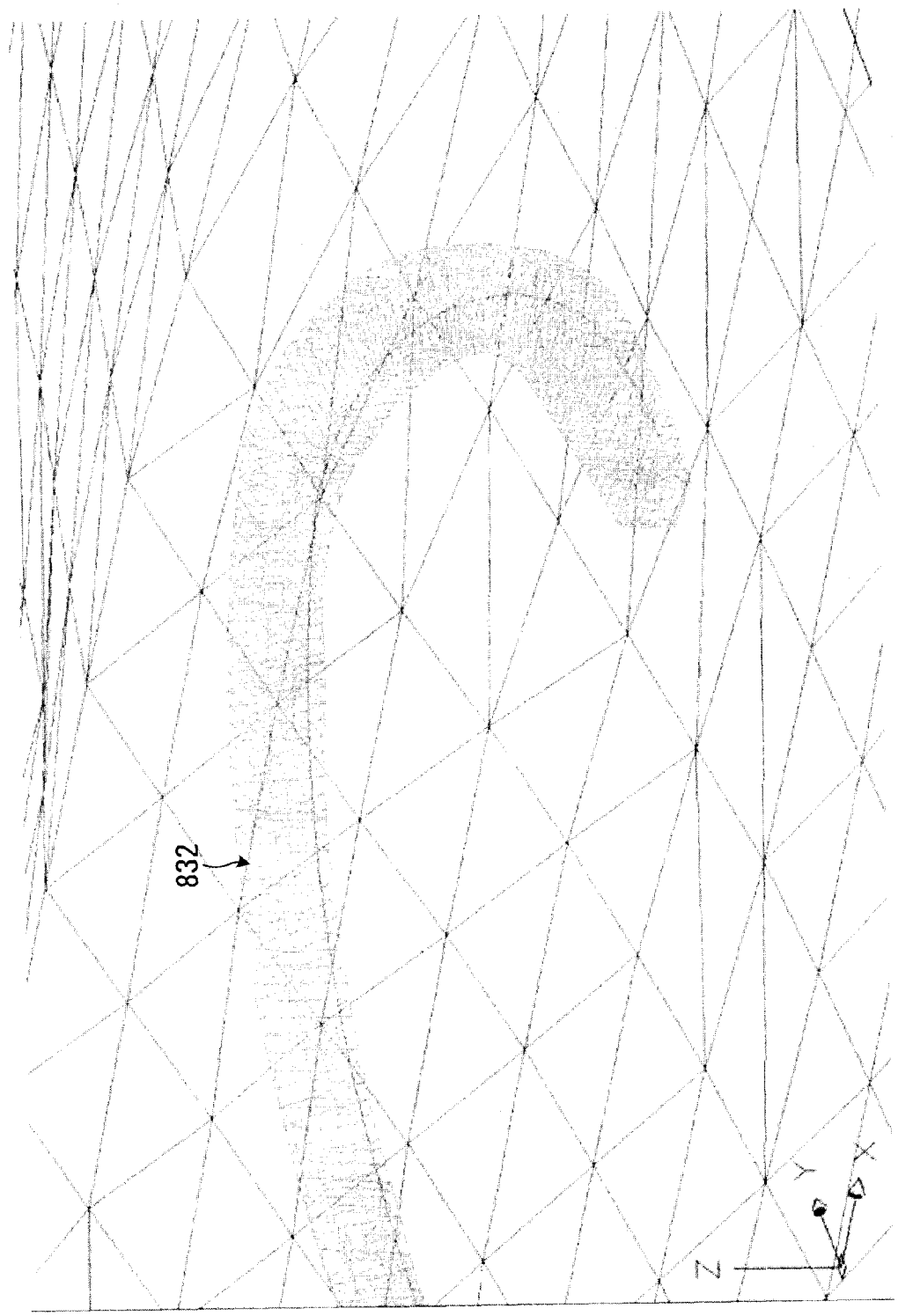
FIG. 25 is a displayed representation of a 3D swept envelope generated by the processor circuit shown in FIG. 2 in accordance with an alternative embodiment of the invention.

Referring to FIG. 25, in one embodiment the intersection areas may be further processed to remove redundant areas of intersection, thereby reducing the number of intersection areas, and thus the size of the data for storing the swept envelope. Such processing may involve determining differences between adjacent areas of intersection and, if such differences are below a change criteria, omitting one or more adjacent areas of intersection, such as the areas of intersection at 830. In this way, redundant data defining the swept envelope is discarded, without compromising the accuracy of the swept envelope representation.

Determining Interference with Obstacles

The 3D swept envelope may be used to identify points of interference between the spatial extents of the vehicle 240 and the terrain. For example, the terrain data may include data defining an obstacle located on the terrain and the processor circuit 150 may be operably configured to determine an intersection between the 3D swept envelope and the obstacle by determining whether there is an intersection between the two elements. Alternatively, a second vehicle may be moved across the terrain, and intersection or spacing between the 3D swept envelopes of each of the vehicles may be determined to determine where sufficient clearance exists between lanes of a roadway, for example. Similarly, the 3D swept envelope of the vehicle may be offset to determine minimum extents of a passageway, such as a tunnel or doorway, through which the vehicle must pass in moving between the initial position and the displaced position.

Magnetically Levitated Vehicle Embodiment

Figure 26:
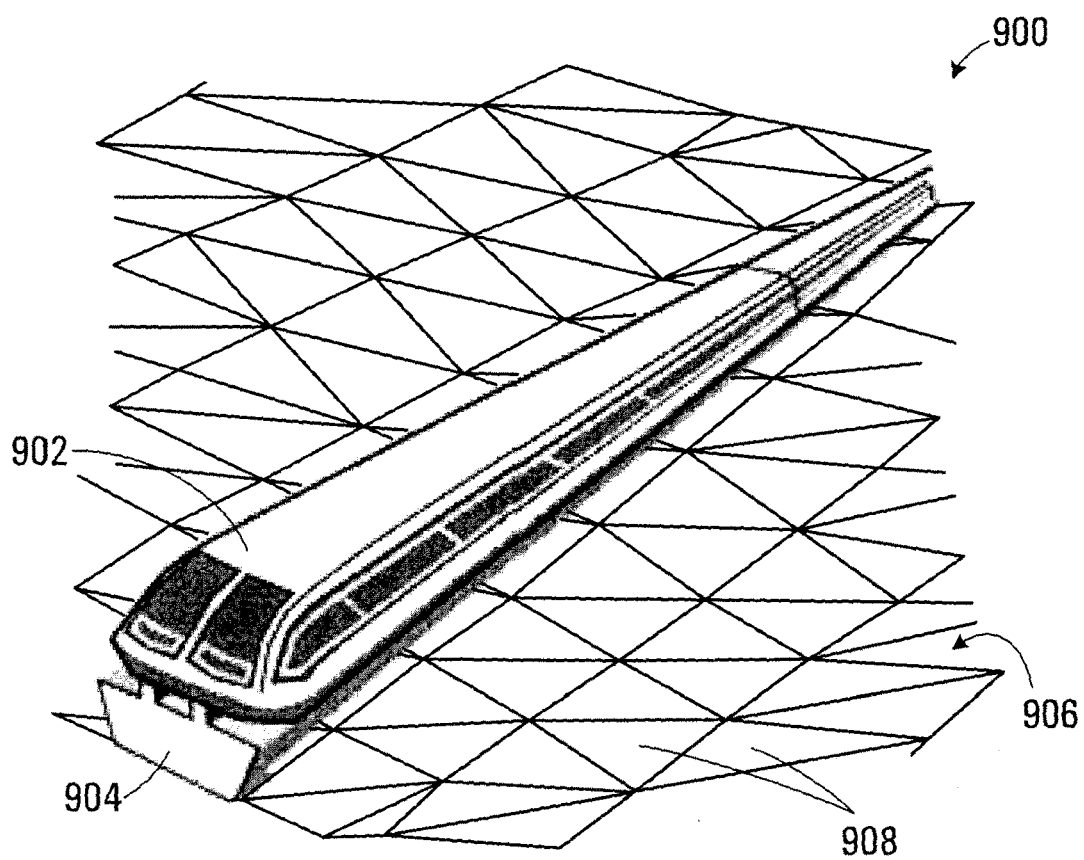
FIG. 26 is a perspective view of a magnetically levitated transport system representation in accordance with an alternative embodiment of the invention.

While the above embodiments have been described in relation to representing a 3D swept envelope of a wheeled vehicle, in other embodiments the 3D swept envelope of a vehicle that is not supported on wheels may be generated by the apparatus 100 shown in FIG. 1. Referring to FIG. 26 a magnetically levitated transport system representation is shown generally at 900, and includes a vehicle 902 received on a guideway 904 for movement along a terrain 906 represented by polygons 908. The guideway 904 extends along and is disposed with respect to the 3D representation of the terrain to provide a path for the vehicle 902, which in this embodiment is a train. In general the guideway 904 may be constructed at grade, below grade, or at some elevation above the terrain 906. An elevation of the guideway 904 with respect to the terrain 906 may be varied along the extent of the guideway to provide a path for the vehicle 902 having a gradient that is suitable for an intended speed of travel.

Figure 27:
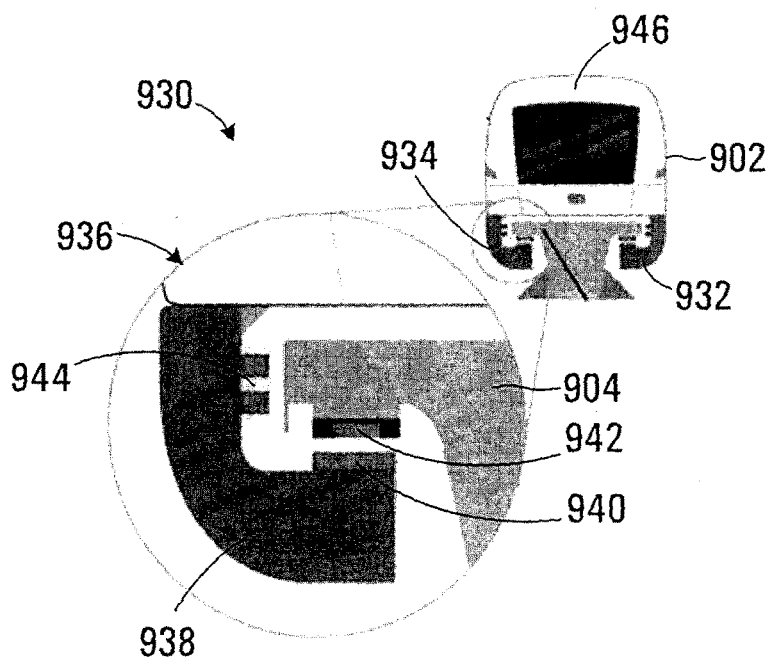
FIG. 27 is a cross sectional view of a magnetic levitation suspension for supporting a vehicle.

Referring to FIG. 27, an example of a magnetic levitation suspension for supporting the vehicle 902 is shown in cross sectional detail at 930 and includes first and second supports 932 and 934. The support 932 is shown in greater detail at 936. The support 932 of the vehicle 902 includes an undercarriage 938 having a support magnet 940 mounted on the undercarriage. The guideway 904 includes a stator 942, which generates a magnetic field that interacts with the magnetic field produced by the support magnet 940. The support 932 also includes a guidance magnet 944 for laterally guiding the vehicle 902 along the guideway 904. In operation, an excitation current provided to the stator 942 provides both a magnetic levitation force for supporting the vehicle 902 above the guideway 904 and a drive force for propelling the vehicle along the guideway. In other embodiments, the magnetic levitation suspension may be otherwise configured to support and guide the vehicle 902.

Figure 28:
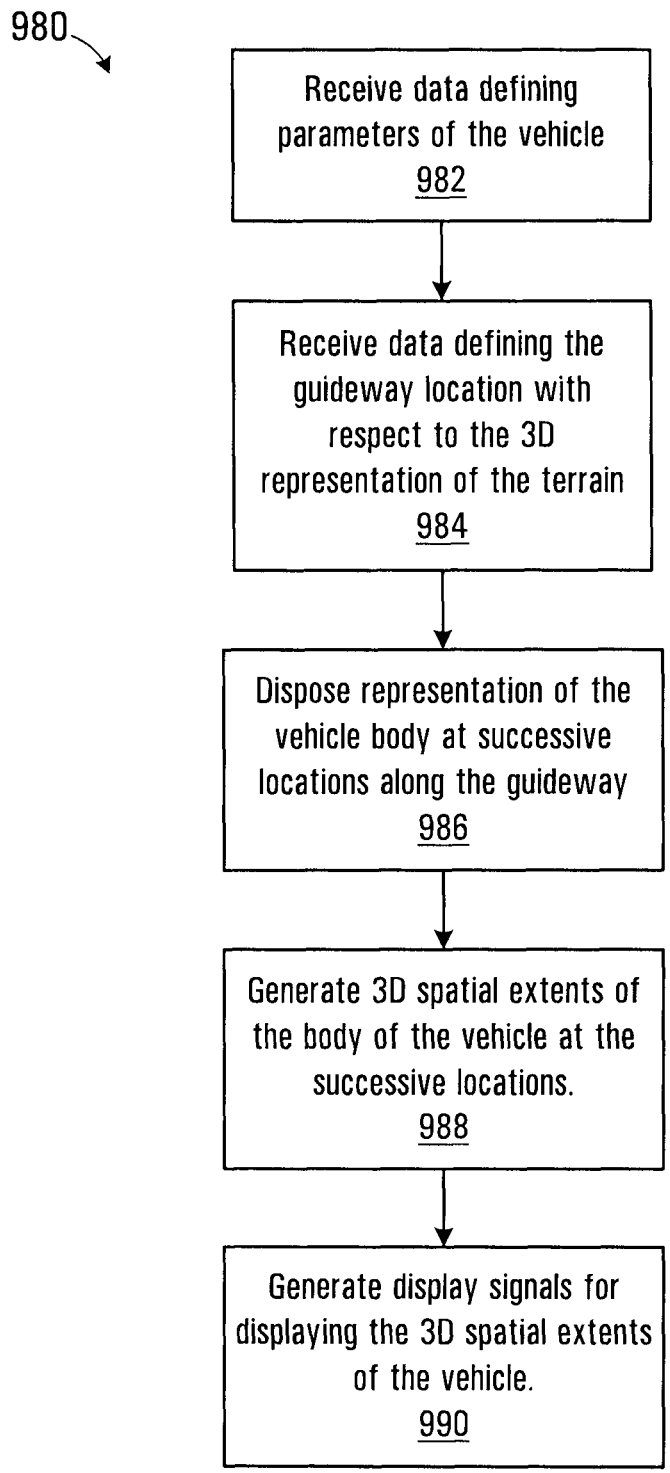
FIG. 28 is a flowchart depicting blocks of code for directing the processor circuit of FIG. 2 to carry out a process for generating a three-dimensional swept envelope of the vehicle shown in FIG. 27.

Referring to FIG. 28, a flowchart depicting blocks of code for directing the processor circuit 150 (shown in FIG. 2) to carry out a process for generating the three-dimensional swept envelope of the vehicle 902 is shown generally at 980. The process 980 begins at block 982, which directs the microprocessor 152 to receive data defining parameters of the vehicle 902. In one embodiment, the parameters include parameters defining an orientation between the supports 932 and 934 and a body 946 of the vehicle 602. In other embodiments the parameters may include further parameters defining aspects of placement and movement of the vehicle 602 with respect to the guideway 604, such as the effect of any additional suspension components on the relative orientation between the supports 932 and 934 and the body 946 of the vehicle. The parameters may thus include support parameters defining relative orientations the support with respect to the guideway, vehicle body parameters defining spatial extents of the body of the vehicle, and linkage parameters defining a linkage between the support and the vehicle body, for example.

Block 984 then directs the microprocessor 152 to receive data defining the location of the guideway 904 with respect to the 3D representation of the terrain 906. Block 986 then directs the microprocessor 152 to dispose a computer representation of the vehicle body 946 at successive locations along the guideway 904 using the parameters. In one embodiment, block 986 my direct the microprocessor 152 to determining a 3D location of the supports 932 and 934 at each successive location along the guideway 904, and using the parameters, determine a 3D location of the vehicle body 946 with respect to the terrain 906.

Block 988 then directs the microprocessor 152 to generate a plurality of 3D spatial extents of the body 946 of the vehicle 902 at the successive locations. The 3D spatial extents define the 3D swept envelope of the vehicle when moving from an initial position to a displaced position along the guideway 904. In general, block 986 directs the microprocessor 152 to carry out processes similar to the processes described above in connection with FIGS. 18 to 23 for generating 3D spatial extents.

The process 980 then continues at block 990, which directs the microprocessor 152 generate signals at the first output 194 and/or second output 196 for displaying the 3D swept envelope on the display 108 or printing the 3D swept envelope on the printer 116.

As described above, once the 3D representation of the swept envelope of the vehicle 902 has been generated, swept envelope may be used to identify points of interference between the spatial extents of the vehicle 902 and the terrain 906 or obstacles disposed proximate the guideway 904 on the terrain.

Suspended Object Embodiment

Figure 29:
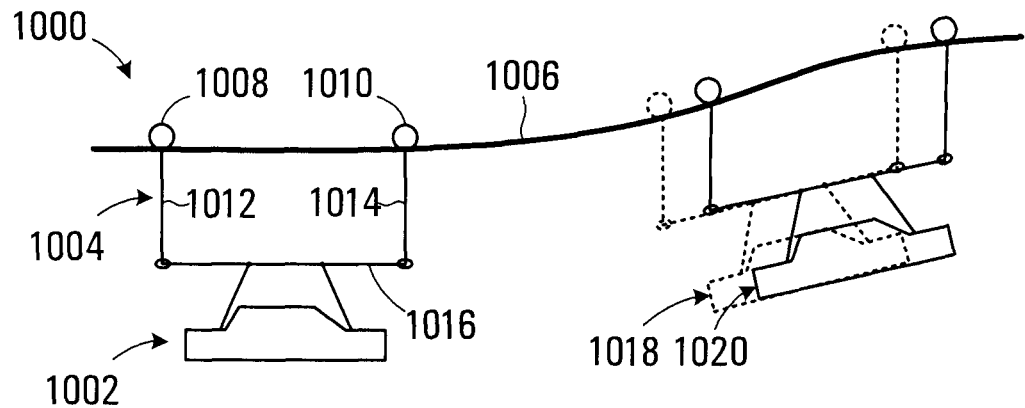
FIG. 29 is a side view of a system for transporting objects in accordance with another embodiment of the invention.

In another embodiment the guiderail may be disposed to suspend an object. Referring to FIG. 29, in a side view of an embodiment of a system for transporting objects is shown generally at 1000. In this embodiment the objects include vehicles 1002 being transported through a factory assembly line (not shown). However in other embodiments the object may include any type of suspended load not limited to a vehicle. The objects 1002 include a support 1004, which is supported for movement along a guideway 1006. In this embodiment the guideway 1006 comprises a single rail, but in other embodiments the object or vehicle 1002 may be supported by more than one rail.

The support 1004 includes wheels 1008 and 1010, which are received in the guideway 1006, and further includes linkages 1012 and 1014, which are pivotably suspended from the wheels such that the supports remain vertically oriented under forces of gravity while moving along the guideway 1006. The support 1004 further includes a cross linkage 1016, extending D between ends of the linkages 1012 and 1014. The linkages 1012, 1014 and 1016 together form a frame that is configured to travel along the guideway 1006. In this embodiment the vehicle 1002 is in rigidly coupled to the frame and movement between successive locations 1018 and 1020 causes the vehicle 1002 to be tilted with respect to a vertical orientation.

Figure 30:
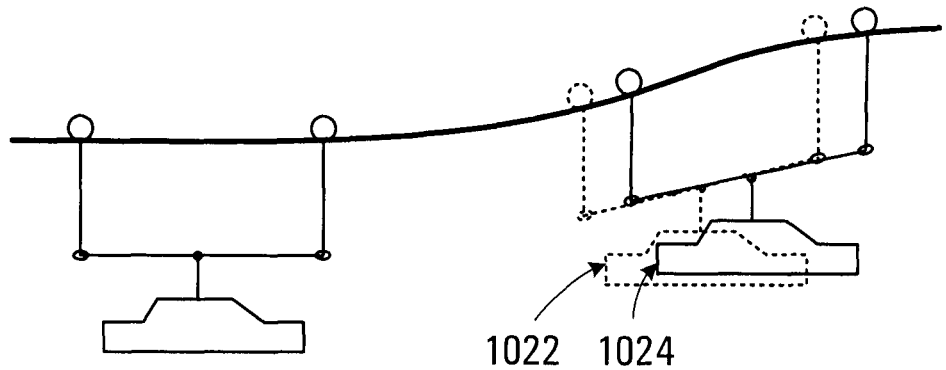
FIG. 30 is a side view of a system for transporting objects in accordance with yet another embodiment of the invention.
Figure 31:
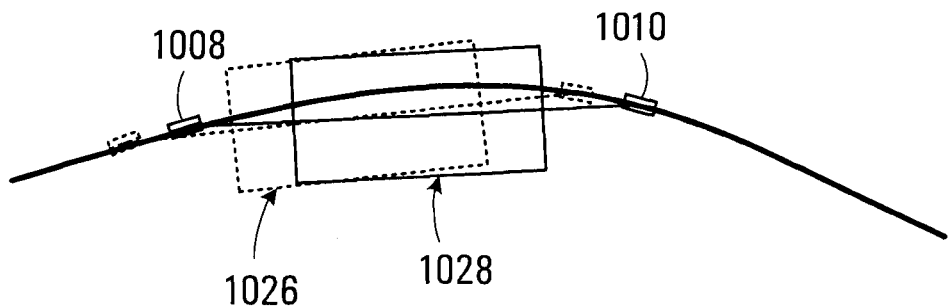
FIG. 31 is a plan view the system for transporting objects shown in FIGS. 29 and 30.

In an alternative embodiment shown in FIG. 30, the vehicle 1002 is pivotably coupled to the frame and movement between successive locations 1022 and 1024 causes the vehicle 1002 to remain orientated in an upright orientation while moving. Referring to FIG. 31, the system 1000 is shown in plan view. The wheels 1008 and 1010 laterally follow the guideway 1006 causing the vehicle 1002 to be disposed at successive locations 1026 and 1028.

The process 980 described above may be implemented substantially as describe in connection with the magnetically levitated vehicle embodiment described above to generate a representation of a 3D swept envelope of the vehicles 1002 moving through the assembly line. At each of the successive locations shown in FIG. 39, FIG. 30, and FIG. 31 the extents of the vehicle are determined by disposing the vehicle 1002 with respect to the guideway 1006 using parameters defining the support 1004.

Similarly, the 3D representation of the swept envelope of the vehicle 1002 may be used to identify points of interference between the spatial extents of the vehicle and structures or obstacles disposed proximate the guideway 1006.

Advantageously, the 3D swept envelope provides a geometric representation of a volume swept by the tractor 242 and trailer 244 when moving between the initial position 254 and the displaced position 256. The 3D swept envelope or swept volume may be used to determine whether there is sufficient clearance between the vehicle and obstacles (not shown) that are located on the terrain 246, other vehicles moving on the terrain, and/or clearances between the vehicle and the terrain itself, for example. Such clearance determinations may be useful in design and/or analysis of roadways, traffic intersections, parking lots, railway lines and interchanges, airport runways, taxiways, and ramps, for example. The 3D swept envelope may also be useful in numerous other applications, and is not limited to the aforementioned examples.

While specific embodiments of the invention have been described and illustrated, such embodiments should be considered illustrative of the invention only and not as limiting the invention as construed in accordance with the accompanying claims.

What is claimed is:

1. A method for generating a computer representation of a three-dimensional (3D) swept envelope of a vehicle having a wheeled chassis operable to support a vehicle body for movement along a terrain, the method comprising:
   receiving terrain data providing a 3D representation of a terrain;
   receiving data defining parameters of the vehicle;
   receiving data defining a path for movement of the vehicle from an initial position on the terrain to a displaced position on the terrain;
   disposing a computer representation of the vehicle on the 3D representation of the terrain at successive locations along said path using said parameters, wherein said disposing comprises:
      determining points of engagement between a computer representation of wheels of the wheeled chassis and the 3D representation of the terrain to dispose the chassis with respect to the terrain; and
      determining a corresponding 3D location of the vehicle body with respect to the terrain; and
   generating a plurality of spatial extents of the vehicle at said successive locations, said spatial extents defining the 3D swept envelope of the vehicle when moving between said initial position and said displaced position.

2. The method of claim 1 wherein generating said plurality of spatial extents of the vehicle comprises:
   generating a plurality of spaced apart intersecting planes along said path; and
   determining an intersection of the computer representation of vehicle with each of said intersection planes at said successive locations of the vehicle along said path.

3. The method of claim 2 wherein generating said plurality of spaced apart intersecting planes comprises generating intersection planes that are perpendicular to said path.

4. The method of claim 2 wherein determining said intersection of the computer representation of the vehicle with each of said intersection planes comprises:
   for each intersection plane, determining a plurality of intersection areas each corresponding to one of said successive locations of the vehicle along said path; and
   forming a union of said plurality of intersection areas to generate a combined intersection area defining a spatial extent of the vehicle moving through said intersection plane.

5. The method of claim 4 wherein determining said plurality of intersection areas comprises:
   representing said vehicle using at least one 3D geometric shape;
   imposing a raster on said intersection plane, said raster comprising a plurality of raster elements; and
   identifying ones of said plurality of raster elements that lie within said 3D geometric shape for each successive location, said identified ones of said plurality of raster elements corresponding to said combined intersection area.

6. The method of claim 1 further comprising generating signals operable to cause at least one of:
   display of a representation of said 3D swept envelope of the vehicle on a computer display; and
   a representation of said 3D swept envelope of the vehicle to be printed on a printer.

7. The method of claim 1 wherein receiving data defining said parameters of the vehicle comprises receiving at least one of:
   chassis parameters defining relative orientations of said wheels of said wheeled chassis;
   vehicle body parameters defining spatial extents of said vehicle body; and
   linkage parameters defining a linkage between the chassis and said vehicle body.

8. The method of claim 1 wherein receiving said data defining said path comprises receiving operator input of a two-dimensional arc and further comprising projecting said arc onto said terrain to obtain a three-dimensional path extending between said initial position and said displaced position on the terrain.

9. The method of claim 1 further comprising receiving operator input of a change to said path, and in response:
   disposing the computer representation of the vehicle on the 3D representation of the terrain at successive locations along said changed path and generating an updated plurality of spatial extents of the vehicle.

10. The method of claim 1 further comprising:
    computing a minimum turning radius for the vehicle;
    computing turning radii associated with said movement from said initial position to said displaced position; and
    causing the path to be limited to include turning radii that are greater than or equal to said minimum turning radius.

11. The method of claim 1 wherein determining points of engagement between the computer representation of the wheels of the wheeled chassis and the 3D representation of the terrain comprises:
    locating a reference point associated with a front axle of the chassis on said path;
    longitudinally rotating the chassis to place a reference point associated with a rear axle of the chassis on the terrain; and
    laterally rolling the chassis to place wheel locations associated with said wheeled chassis on or proximate said terrain.

12. The method of claim 1 wherein determining said corresponding 3D location of the vehicle body with respect to the terrain comprises:

disposing a computer representation of the vehicle body on the chassis;

determining a weight distribution proportion for each wheel; and calculating a deflection of a suspension associated with each wheel to generate said 3D location of the computer representation of the vehicle body with respect to the chassis.

13. The method of claim 1 further comprising identifying points of interference between said plurality of spatial extents of the vehicle at said successive locations and said terrain.

14. The method of claim 1 further comprising receiving data defining at least one obstacle located on said terrain and further comprising identifying points of interference between said plurality of spatial extents of the vehicle at said successive locations and said at least one obstacle.

15. The method of claim 1 wherein the vehicle comprises a first vehicle and further comprising:

receiving data defining a 3D swept envelope of a second vehicle with respect to the 3D representation of the terrain; and identifying points of interference between said plurality of spatial extents of the first vehicle at said successive locations and said 3D swept envelope of the second vehicle.

16. The method of claim 1 further comprising offsetting the 3D swept envelope of the vehicle to determine minimum extents of a passageway through which the vehicle must pass in moving between the initial position and the displaced position.

17. The method of claim 1 further comprising:

receiving a definition of a plane intersecting the path;

determining extents of an area of intersection between said plane and said spatial extents of the vehicle as the vehicle moves through said plane along said path; and offsetting said area of intersection to define and locate a structure through which the vehicle must pass in moving between said initial position and said displaced position.

18. The method of claim 1 wherein the vehicle is configured for movement along a track disposed on the terrain, the track being operable to receive and guide said wheels of the wheeled chassis and wherein receiving said data defining said path from said initial position to said displaced position comprises receiving data defining a location of said tracks with respect to said 3D representation of said terrain.

19. The method of claim 1 wherein determining said corresponding 3D location of the vehicle body with respect to the terrain comprises:

displacing a computer representation of the vehicle body from a computer representation of the chassis by a distance corresponding to:

a ground clearance parameter associated with the vehicle body; and a deflection of a suspension between the chassis and the body.

20. The method of claim 19 wherein displacing the computer representation of the vehicle body comprises displacing the computer representation of the vehicle body at each wheel location in accordance with a weight distribution proportion at said wheel location.

21. The method of claim 1 wherein the vehicle has a support for supporting the vehicle body for movement along a guideway and wherein receiving data defining the path comprises receiving data defining the guideway location with respect to the 3D representation of the terrain, the guideway being operable to guide and support the vehicle for movement from the initial position on the terrain to the displaced position on the terrain.

22. The method of claim 21 wherein said disposing comprises:

determining a 3D location of the support at each successive location along the guideway; and using said parameters to determine a 3D location of the vehicle body with respect to the terrain.

23. The method of claim 22 wherein the support comprises a plurality of supports and wherein determining said 3D location of the vehicle support comprises determining a 3D location of each of the plurality of supports at each successive location along the guideway and wherein using said parameters to determine said 3D location of the vehicle body with respect to the terrain comprises using said parameters to determine a 3D location of the vehicle body with respect to the determined locations of each of the plurality of supports.

24. The method of claim 21 wherein said support comprises a magnetic suspension operable to support the vehicle for movement along the guideway.

25. The method of claim 21 wherein the vehicle comprises a load supported for movement along an overhead guideway.

26. The method of claim 25 wherein the vehicle comprises a load suspended from the support and wherein the support includes at least one wheel for coupling the support to the guideway for movement.

27. A non-transitory computer readable medium encoded with codes for directing a processor circuit to generate a computer representation of a three-dimensional (3D) swept envelope of a vehicle having a wheeled chassis operable to support a vehicle body for movement along a terrain, the codes directing the processor circuit to:

receive terrain data providing a 3D representation of a terrain;

receive data defining parameters of the vehicle;

receive data defining a path for movement of the vehicle from an initial position on the terrain to a displaced position on the terrain;

dispose a computer representation of the vehicle on the 3D representation of the terrain at successive locations along said path using said parameters by:

determining points of engagement between a computer representation of wheels of the wheeled chassis and the 3D representation of the terrain to dispose the chassis with respect to the terrain; and determining a corresponding 3D location of the vehicle body with respect to the terrain; and generate a plurality of spatial extents of the vehicle at said successive locations, said spatial extents defining the 3D swept envelope of the vehicle when moving between said initial position and said displaced position.

28. An apparatus for generating a computer representation of a three-dimensional (3D) swept envelope of a vehicle having a wheeled chassis operable to support a vehicle body for movement along a terrain, the apparatus comprising a processor circuit operably configured to:

receive terrain data providing a 3D representation of a terrain;

receive data defining parameters of the vehicle;

receive data defining a path for movement of the vehicle from an initial position on the terrain to a displaced position on the terrain;

dispose a computer representation of the vehicle on the 3D representation of the terrain at successive locations along said path using said parameters by:
  determining points of engagement between a computer representation of wheels of the wheeled chassis and the 3D representation of the terrain to dispose the chassis with respect to the terrain; and
  determining a corresponding 3D location of the vehicle body with respect to the terrain; and
generate a plurality of spatial extents of the vehicle at said successive locations, said spatial extents defining the 3D swept envelope of the vehicle when moving between said initial position and said displaced position.

29. The apparatus of claim 28 wherein said processor circuit is operably configured to generate said plurality of spatial extents of the vehicle by:
  generating a plurality of spaced apart intersecting planes along said path; and
  determining an intersection of the computer representation of vehicle with each of said intersection planes at said successive locations of the vehicle along said path.

30. The apparatus of claim 29 wherein said processor circuit is operably configured to generate said plurality of spaced apart intersecting planes by generating intersection planes that are perpendicular to said path.

31. The apparatus of claim 29 wherein said processor circuit is operably configured to determine said intersection of the computer representation of the vehicle with each of said intersection planes by:
  for each intersection plane, determining a plurality of intersection areas each corresponding to one of said successive locations of the vehicle along said path; and
  forming a union of said plurality of intersection areas to generate a combined intersection area defining a spatial extent of the vehicle moving through said intersection plane.

32. The apparatus of claim 31 wherein said processor circuit is operably configured to determine said plurality of intersection areas by:
  representing said vehicle using at least one 3D geometric shape;
  imposing a raster on said intersection plane, said raster comprising a plurality of raster elements; and
  identifying ones of said plurality of raster elements that lie within said 3D geometric shape for each successive location, said identified ones of said plurality of raster elements corresponding to said combined intersection area.

33. The apparatus of claim 28 wherein said processor circuit is operably configured to receive said data defining said path by receiving operator input of a two-dimensional arc and said processor circuit is operably configured to project said arc onto said terrain to obtain a three-dimensional path extending between said initial position and said displaced position on the terrain.

34. The apparatus of claim 28 wherein said processor circuit is operably configured to receive operator input of a change to said path, and in response:
  dispose the computer representation of the vehicle on the 3D representation of the terrain at successive locations along said changed path and generating an updated plurality of spatial extents of the vehicle.

35. The apparatus of claim 28 wherein said processor circuit is operably configured to:
  compute a minimum turning radius for the vehicle;
  compute turning radii associated with said movement from said initial position to said displaced position; and
  cause the path to be limited to include turning radii that are greater than or equal to said minimum turning radius.

36. The apparatus of claim 28 wherein said processor circuit is operably configured to determine points of engagement between the computer representation of the wheels of the wheeled chassis and the 3D representation of the terrain by:
  locating a reference point associated with a front axle of the chassis on said path;
  longitudinally rotating the chassis to place reference point associated with a rear axle of the chassis on the terrain; and
  laterally rolling the chassis to place wheel locations associated with said wheeled chassis on or proximate said terrain.

37. The apparatus of claim 28 wherein said processor circuit is operably configured to determine said corresponding 3D location of the vehicle body with respect to the terrain by:
  disposing a computer representation of the vehicle body on the chassis;
  determining a weight distribution proportion for each wheel; and
  calculating a deflection of a suspension associated with each wheel to generate said 3D location of the computer representation of the vehicle body with respect to the chassis.

38. The apparatus of claim 28 wherein said processor circuit is operably configured to identify points of interference between said plurality of spatial extents of the vehicle at said successive locations and said terrain.

39. The apparatus of claim 28 wherein said processor circuit is operably configured to receive data defining at least one obstacle located on said terrain and to identify points of interference between said plurality of spatial extents of the vehicle at said successive locations and said at least one obstacle.

40. The apparatus of claim 28 wherein the vehicle comprises a first vehicle and wherein said processor circuit is operably configured to:
  receive data defining a 3D swept envelope of a second vehicle with respect to the 3D representation of the terrain; and
  identify points of interference between said plurality of spatial extents of the first vehicle at said successive locations and said 3D swept envelope of the second vehicle.

41. The apparatus of claim 28 wherein said processor circuit is operably configured to offset the 3D swept envelope of the vehicle to determine minimum extents of a passageway through which the vehicle must pass in moving between the initial position and the displaced position.

42. The apparatus of claim 28 wherein said processor circuit is operably configured to:
  receive a definition of a plane intersecting the path;
  determine extents of an area of intersection between said plane and said spatial extents of the vehicle as the vehicle moves through said plane; and
  offset said area of intersection to define and locate a structure through which the vehicle must pass in moving between said initial position and said displaced position.

43. The apparatus of claim 28 wherein the vehicle is configured for movement along a track disposed on the terrain, the track being operable to receive and guide said wheels of the wheeled chassis and wherein said processor circuit is operably configured to receive said data defining said path from said initial position to said displaced position by receiving data defining a location of said tracks with respect to said 3D representation of said terrain.

44. The apparatus of claim 28 wherein said processor circuit is operably configured to determine said corresponding 3D location of the vehicle body with respect to the terrain by:
displacing a computer representation of the vehicle body from a computer representation of the chassis by a distance corresponding to:
a ground clearance parameter associated with the vehicle body; and
a deflection of a suspension between the chassis and the body.

45. The apparatus of claim 44 wherein said processor circuit is operably configured to displace the computer representation of the vehicle body by displacing the computer representation of the vehicle body at each wheel location in accordance with a weight distribution proportion at said wheel location.

46. The apparatus of claim 28 wherein the vehicle has a support for supporting the vehicle body for movement along a guideway, and wherein the processor circuit is operably configured to:
receive data defining the path by receiving data defining the guideway location with respect to the 3D representation of the terrain, the guideway being operable to guide and support the vehicle for movement from the initial position on the terrain to the displaced position on the terrain.

47. The apparatus of claim 46 wherein said processor circuit is operably configured to dispose said computer representation of the vehicle body by:
determining a 3D location of the support at each successive location along the guideway; and
using said parameters to determine a 3D location of the vehicle body with respect to the terrain.

48. The apparatus of claim 47 wherein the support comprises a plurality of supports and wherein said processor circuit is operably configured to determine said 3D location of the vehicle support by determining a 3D location of each of the plurality of supports at each successive location along the guideway and to use said parameters to determine said 3D location of the vehicle body with respect to the terrain by using said parameters to determine a 3D location of the vehicle body with respect to the determined locations of each of the plurality of supports.

49. The apparatus of claim 46 wherein said support comprises a magnetic suspension operable to support the vehicle for movement along the guideway.

50. The apparatus of claim 46 wherein the vehicle comprises a load supported for movement along an overhead guideway.

51. The apparatus of claim 50 wherein the vehicle comprises a load suspended from the support and wherein the support includes at least one wheel for coupling the support to the guideway for movement.

52. The apparatus of claim 46 wherein the 3D representation of the terrain comprises a 3D representation of a factory floor.

* * * * *